(12) United States Patent
Kuisma

(10) Patent No.: US 10,884,018 B2
(45) Date of Patent: Jan. 5, 2021

(54) PIEZOELECTRIC ROTATIONAL MEMS RESONATOR

(71) Applicant: MURATA MANUFACTURING CO., LTD., Nagaokakyo (JP)

(72) Inventor: Heikki Kuisma, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 285 days.

(21) Appl. No.: 15/988,670

(22) Filed: May 24, 2018

(65) Prior Publication Data

US 2018/0340955 A1    Nov. 29, 2018

(30) Foreign Application Priority Data

May 24, 2017    (FI) .................................... 20175469

(51) Int. Cl.
  *G01C 19/5712*    (2012.01)
  *G01C 19/5747*    (2012.01)
  (Continued)

(52) U.S. Cl.
  CPC ...... *G01P 15/0922* (2013.01); *G01C 19/5642* (2013.01); *G01C 19/5712* (2013.01); *G01C 19/5747* (2013.01); *G01C 19/5769* (2013.01); *H01L 41/0946* (2013.01); *H03H 9/02338* (2013.01); *H03H 9/02362* (2013.01); *H03H 9/2405* (2013.01)

(58) Field of Classification Search
  CPC ............ G01C 19/5712; G01C 19/5719; G01C 19/574; G01C 19/5642; G01C 19/5747; G01C 19/5769; G01C 19/5762
  See application file for complete search history.

(56) References Cited

U.S. PATENT DOCUMENTS

| 5,166,571 A | 11/1992 | Konno et al. |
| 6,561,028 B1 | 5/2003 | Aigner et al. |

(Continued)

FOREIGN PATENT DOCUMENTS

| EP | 1 688 705 A2 | 8/2006 |
| EP | 2 899 503 A1 | 7/2015 |

(Continued)

OTHER PUBLICATIONS

European Search Report application No. EP 18 17 3725 dated Sep. 20, 2018.

(Continued)

*Primary Examiner* — Helen C Kwok
(74) *Attorney, Agent, or Firm* — Squire Patton Boggs (US) LLP

(57) ABSTRACT

This disclosure reveals a resonator where at least one suspended inertial mass is driven into rotational oscillation by a piezoelectric drive transducer, or where the rotational motion of at least one suspended inertial mass is sensed by a piezoelectric sense transducer. The disclosure is based on the idea of attaching suspenders to the inertial mass with at least one flexure, which allows the end of the suspender which is attached to the inertial mass to rotate in relation to the inertial mass at this attachment point when the inertial mass is in motion. The resonator may be employed in a resonator system, a clock oscillator or a gyroscope.

21 Claims, 15 Drawing Sheets

(51) Int. Cl.
   *G01C 19/5769* (2012.01)
   *G01C 19/5642* (2012.01)
   *G01P 15/09* (2006.01)
   *H01L 41/09* (2006.01)
   *H03H 9/02* (2006.01)
   *H03H 9/24* (2006.01)

(56) References Cited

U.S. PATENT DOCUMENTS

| | | |
|---|---|---|
| 2004/0250620 A1 | 12/2004 | Nicu et al. |
| 2006/0156814 A1 | 7/2006 | Blomqvist |
| 2006/0169041 A1* | 8/2006 | Madni ................ G01C 19/5607 73/504.02 |
| 2009/0320594 A1 | 12/2009 | Ohuchi et al. |
| 2010/0077858 A1 | 4/2010 | Kawakubo et al. |
| 2010/0083756 A1 | 4/2010 | Merz et al. |
| 2010/0242604 A1* | 9/2010 | Sammoura ............. G01P 15/18 73/514.34 |
| 2010/0309536 A1* | 12/2010 | Akanuma .......... G02B 26/0858 359/200.8 |
| 2010/0313657 A1 | 12/2010 | Trusov et al. |
| 2011/0132087 A1 | 6/2011 | Ohms et al. |
| 2011/0265564 A1 | 11/2011 | Acar et al. |
| 2011/0270569 A1* | 11/2011 | Stephanou .............. H01L 41/25 702/141 |
| 2013/0019682 A1* | 1/2013 | Hsu .................... G01C 19/5719 73/514.01 |
| 2013/0091948 A1 | 4/2013 | Yamamoto |
| 2013/0283909 A1 | 10/2013 | Furuhata |
| 2014/0266170 A1 | 9/2014 | Seeger et al. |
| 2014/0283602 A1 | 9/2014 | Yamamoto |
| 2015/0068308 A1* | 3/2015 | Blomqvist ......... G01C 19/5712 73/504.12 |
| 2015/0316377 A1* | 11/2015 | Gerson ............. G01C 19/5642 73/504.15 |
| 2016/0211778 A1 | 7/2016 | Okada et al. |
| 2018/0340775 A1* | 11/2018 | Kuisma .............. G01C 19/5712 |
| 2018/0340776 A1* | 11/2018 | Kuisma .............. G01C 19/5642 |
| 2018/0342667 A1* | 11/2018 | Kuisma .............. G01C 19/5747 |

FOREIGN PATENT DOCUMENTS

| | | |
|---|---|---|
| EP | 3 034 997 A1 | 6/2016 |
| JP | 2002-267451 A | 9/2002 |
| JP | 2010-256332 A | 11/2010 |
| JP | 2011158319 A | 8/2011 |
| JP | 2012-149961 A | 8/2012 |
| JP | 2016-001157 A | 1/2016 |
| WO | 2006/039560 A2 | 4/2006 |
| WO | 2011/136972 A1 | 11/2011 |
| WO | 2016/097117 A1 | 6/2016 |

OTHER PUBLICATIONS

Finnish Search Report corresponding to Appln. No. 20175467, dated Dec. 21, 2017.
Jing-Quan Liu et al., "A MEMS-based piezoelectric power generator array for vibration energy harvesting", Microelectronics Journal, Elsevier Ltd., Feb. 20, 2008, vol. 39, No. 5, pp. 802-806.
Pradeep Pai et al., "Magnetically Coupled Resonators for Rate Integrating Gyroscopes", 2014 IEEE Sensors, Nov. 2, 2014, 4 pages.
Finnish Search Report corresponding to Appln. No. 20175892, dated Apr. 18, 2018.
Finnish Search Report corresponding to Appln. No. 20175469, dated Dec. 21, 2017.
I. Roland et al., GaAs-based tuning fork microresonators: A first step towards a GaAs-based coriolis 3-axis Micro-Vibrating Rate Gyro (GaAs 3-axis µCVG), Sensors and Actuators A: Physical, Jul. 19, 2011, vol. 172, No. 1, pp. 204-211.
Finnish Search Report corresponding to Appln. No. 20175850, dated Apr. 18, 2018.
Sep. 19, 2018 Search Report issued in European Patent Application No. 18173731.
Sep. 25, 2018 Search Report issued in European Patent Application No. 18173764.
Sep. 26, 2018 Search Report issued in European Patent Application No. 18173736.

* cited by examiner

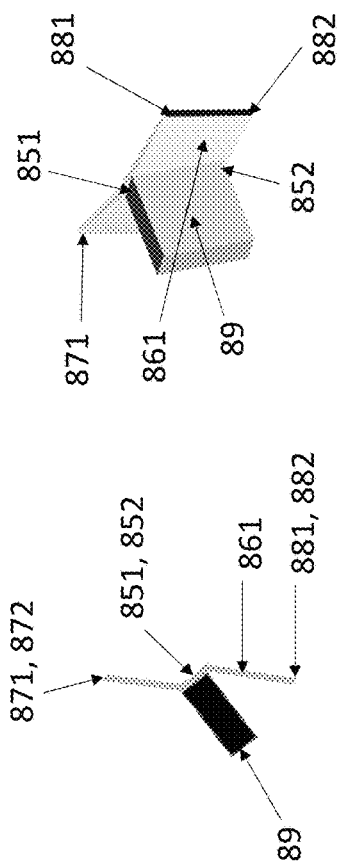
Figure 11
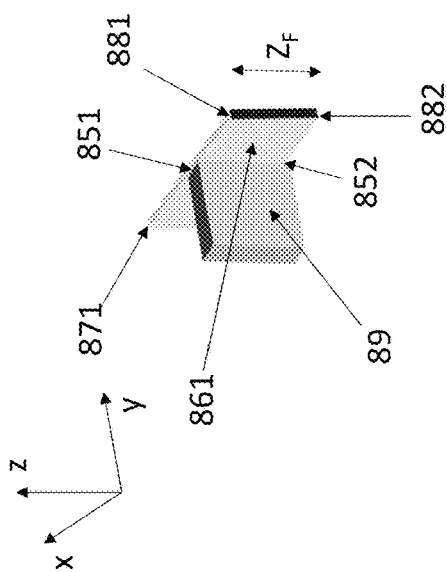
Figure 9
Figure 10
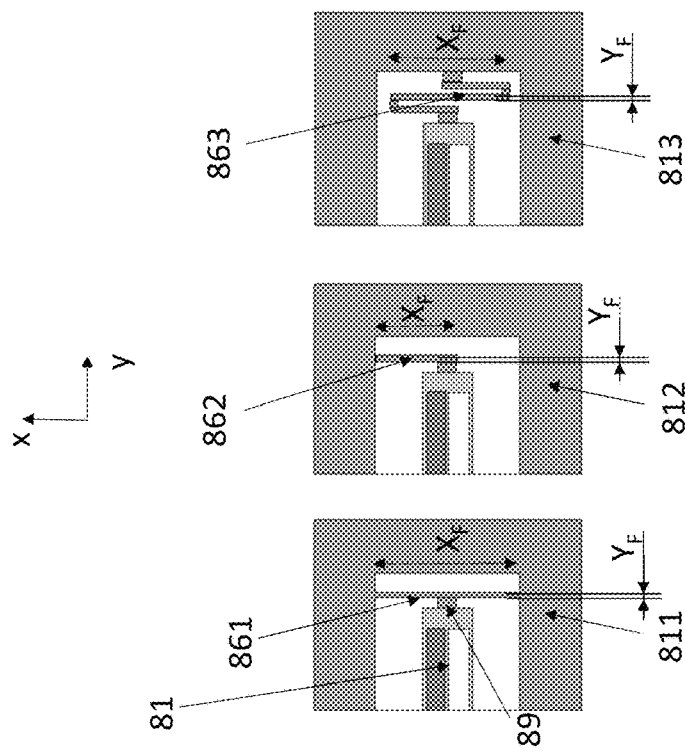
Figure 8

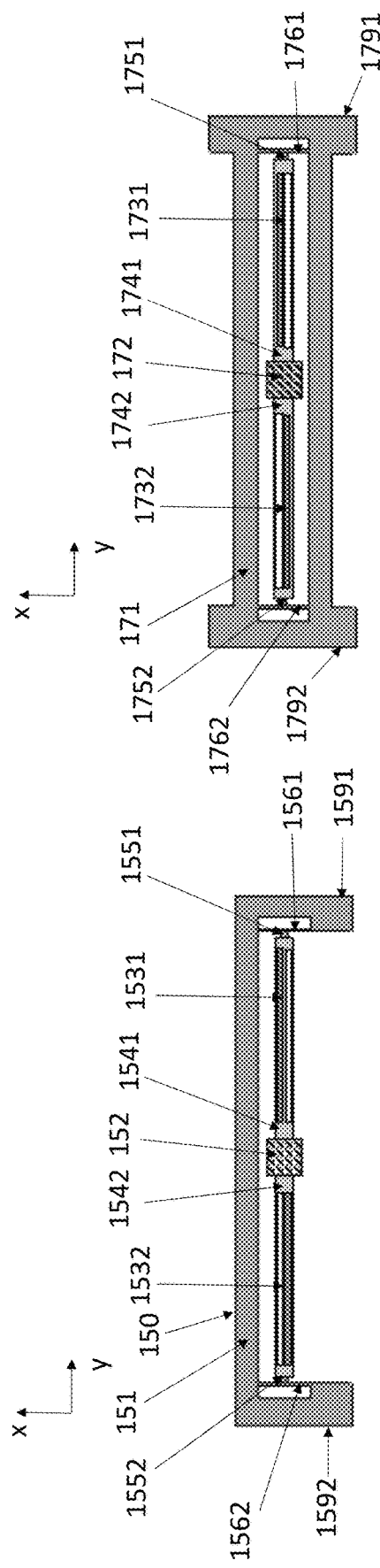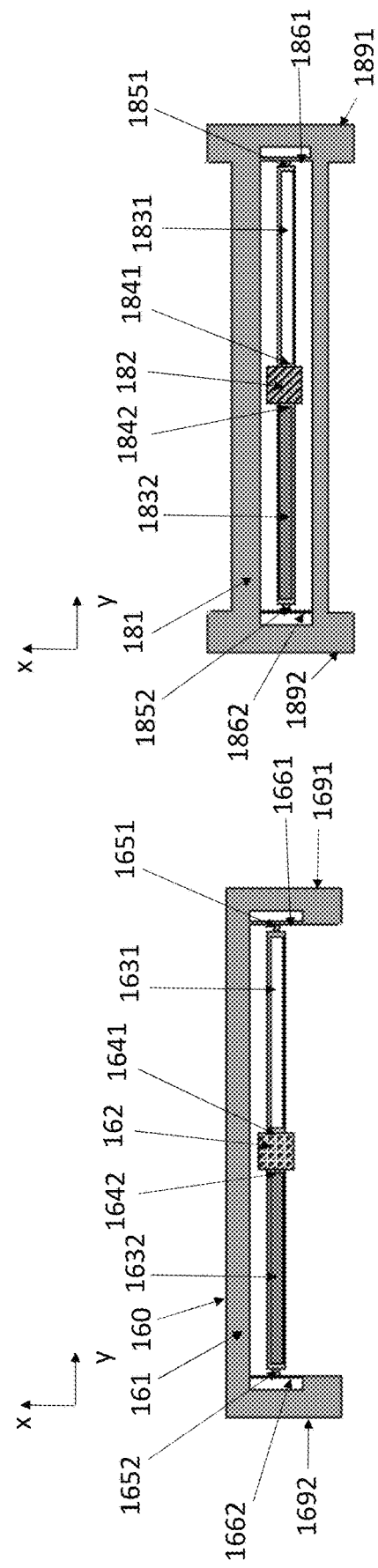
Figure 15
Figure 16
Figure 17
Figure 18

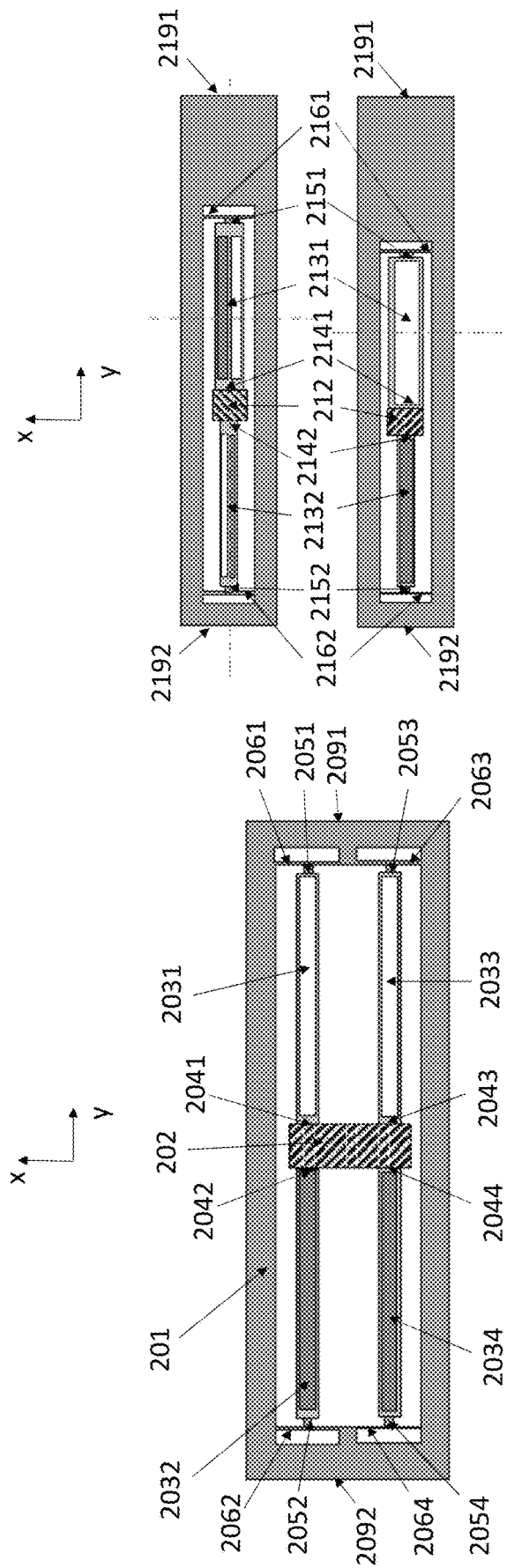

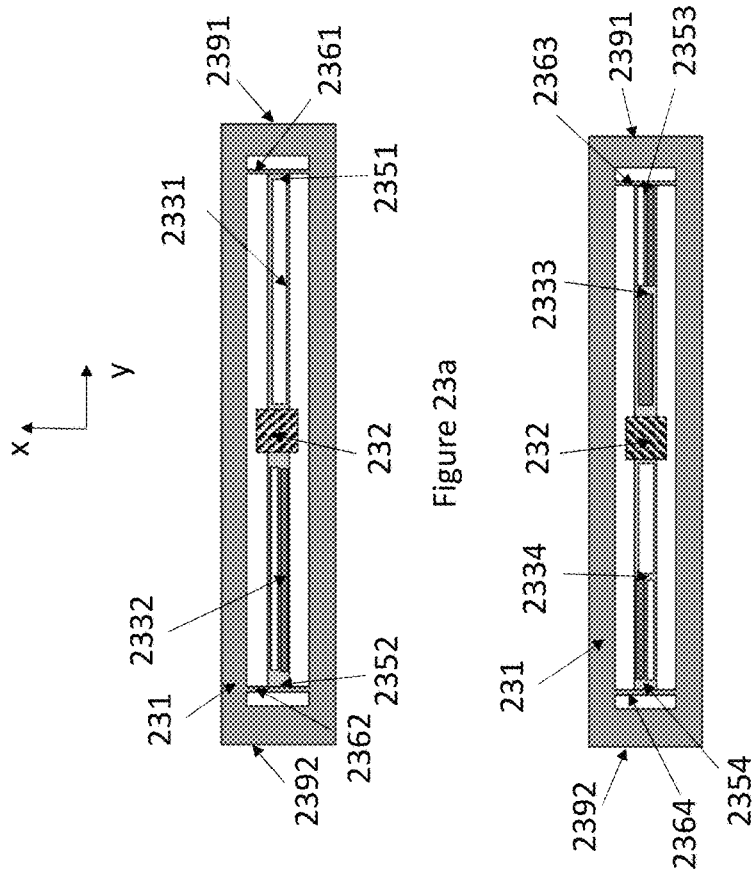
Figure 23a
Figure 23b
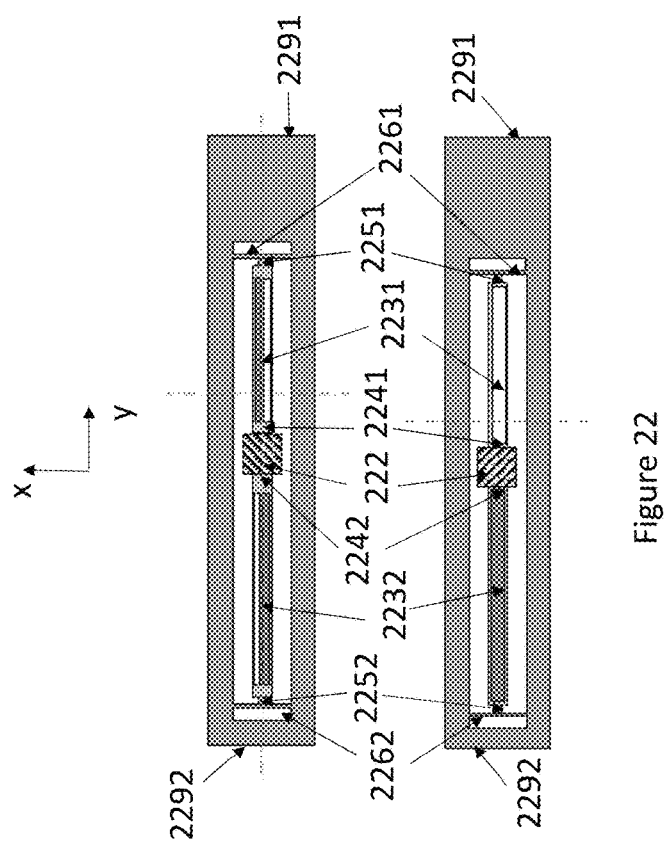
Figure 22

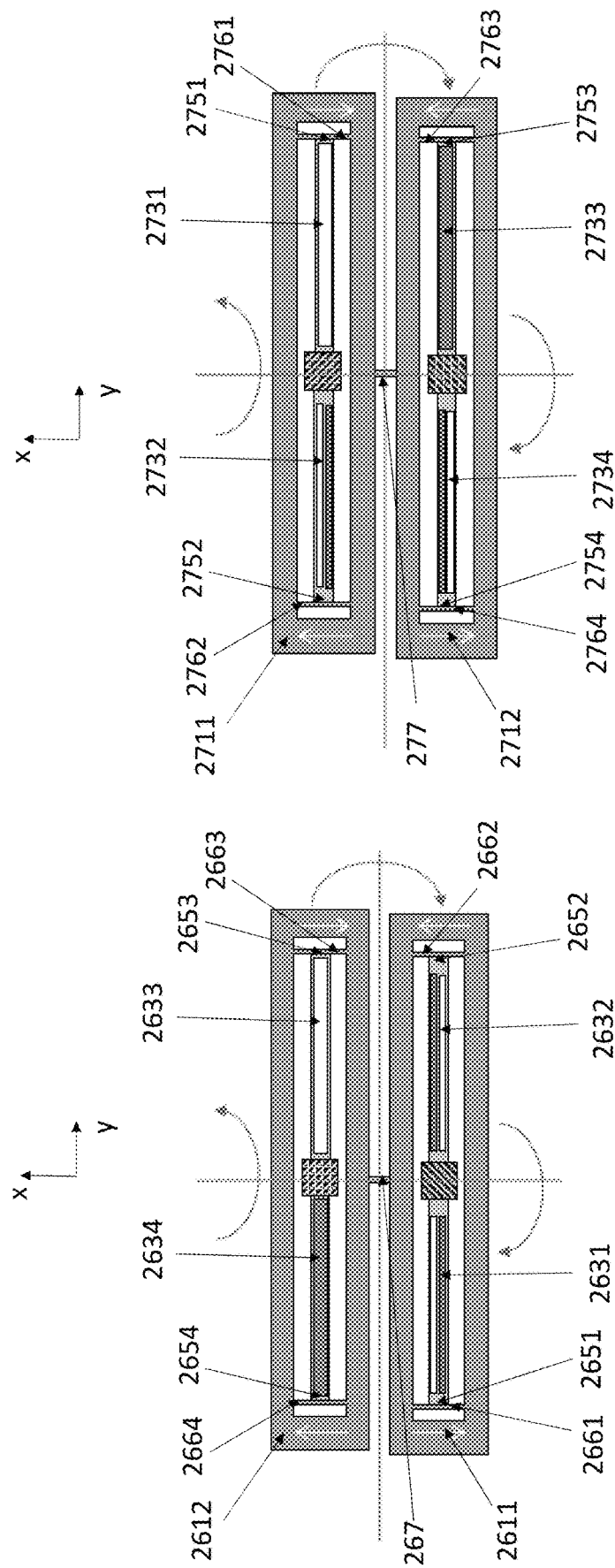

PIEZOELECTRIC ROTATIONAL MEMS RESONATOR

FIELD OF THE DISCLOSURE

The present disclosure relates to MEMS resonators, and more particularly to MEMS resonators where one or more mass elements are driven into rotational motion by piezoelectric actuation or where the rotational motion of one or more mass elements is detected by piezoelectric means. The present disclosure further concerns gyroscopes and clock oscillators implemented with piezoelectric rotational MEMS resonators.

BACKGROUND OF THE DISCLOSURE

The resonators described in this disclosure comprise an inertial mass element suspended from at least one spring structure. The inertial mass element is set into primary oscillating motion by a periodic actuating force. It can be mechanically coupled to other mass elements.

FIG. 1 shows a simplified illustration of a MEMS resonator structure. An inertial mass 11 is suspended from a fixed frame 12 by suspenders 13. In this disclosure, a "fixed" object means an object which is much larger than the MEMS resonator structure, such as the supporting base upon which the MEMS structures are formed, or alternatively an object which is securely attached to the much larger structure and incapable of moving in any direction in relation to this structure. The term "anchor point" refers to a region where partly mobile objects such as suspenders may be attached to a fixed object. The term "attachment point" refers to a region where two objects, either fixed or mobile, are attached to each other.

In this disclosure, a "suspended" object means an object which is attached to a fixed base via flexible means such as springs or beams. In silicon-based MEMS applications, these springs and beams typically comprise regions of silicon which are thin in at least one dimension, so that they are flexible enough to be bent or twisted by the movement of an actuator, or by the movement of an inertial mass to which they are attached. In piezoelectric MEMS applications, these springs and beams should be flexible enough to be bent or twisted by piezoelectric transducers. In this disclosure, the term "suspender" will be used as a general term for a spring or beam which attaches a mobile inertial mass to a fixed object.

The inertial mass 11 in FIG. 1 may rotate in relation to its depicted initial rest position in the xy-plane in two different modes. In this disclosure, the term "in-plane oscillation" refers to rotational oscillation about the z-axis in FIG. 1. The term "out-of-plane oscillation" refers to rotational oscillation about any axis in the xy-plane, such as the y-axis, for example. The plane defined by the rest position of the inertial mass 11 (which coincides with the plane of the frame 12 in FIG. 1) will also be called the "mass plane" or "inertial mass plane".

The coordinate system indicated in the Figures of this disclosure includes a y-axis parallel to the longitudinal direction of the inertial mass and a transversal x-axis which is orthogonal to the y-axis and lies in the mass plane. The longitudinal dimension of the inertial mass is typically larger than its transversal dimension in this disclosure. The vertical z-axis is orthogonal to both the y-axis and the x-axis. As mentioned, the mass plane is defined by the rest position of the inertial mass. In other words, the mass plane in a resonator is parallel to the top surface of an inertial mass when the inertial mass is not in motion. "In-plane" rotation refers in this disclosure to rotational movement within the mass plane, while "out-of-plane" rotation refers to rotational movement out of the mass plane.

The actuating force which sets an inertial mass in motion in MEMS resonators is typically either electromagnetic, electrostatic or piezoelectric. An exemplary setup for piezoelectric actuation is illustrated in FIG. 2. The inertial mass 21 is in this case shaped like a frame with a central opening and a fixed anchor point 22 within the central opening. The inertial mass is suspended from the anchor point 22 by suspenders 231 and 232. One end of each suspender is attached to the anchor point 22 at its first attachment point 241, 242, and the other end is attached to the inertial mass at its second attachment point 251, 252. The suspenders 231 and 232 are at least partially coated with piezoelectric transducers which can generate both in-plane and out-of-plane oscillation, as will be described in more detail below. Electrical contacts may be drawn to these transducers for example through the anchor point 22 or through separate loose springs dedicated for this purpose.

Piezoelectric transducers on suspenders can be used (firstly) to set and maintain the inertial mass in motion, and (secondly) to detect the motion of the inertial mass. In this disclosure, the prefix "drive" will be used for all mechanical and electrical means and methods which relate to setting and maintaining the inertial mass in rotational oscillation. The prefix "sense" will be used for the mechanical and electrical means and methods which relate to detecting the rotational oscillation of the inertial mass.

In this disclosure, piezoelectric transducers which drive the resonator are called drive transducers. When a drive voltage is applied to the drive electrodes of a drive transducer, the transducer bends the suspender on which it is located. This bending movement sets the inertial mass in motion. When an alternating drive voltage is set to a suitable frequency, the inertial mass will undergo rotational oscillation in resonance.

Piezoelectric transducers which sense the movement of the inertial mass are called sense transducers in this disclosure. Sense transducers may be attached either on suspenders which are connected to the same inertial mass to which a drive transducer is attached, or on suspenders which are connected to other inertial masses which are mechanically coupled to the inertial mass driven by a drive transducer. The oscillating movement of the inertial mass bends the suspender on which the sense transducers is located, and this generates charge accumulation of opposite sign in sense electrodes on the two sides of the transducer. A sense voltage signal, whose amplitude is proportional to the amplitude of the oscillating motion of the inertial mass, and whose frequency is the same as oscillation frequency of the inertial mass, can be read from the sense electrodes.

Piezoelectric drive transducers and sense transducers may be located either on separate suspenders or on the same suspenders, as described in more detail below. A transducer may sometimes be used as a drive transducer, and sometimes as a sense transducer. In this disclosure, the transducer may be said to operate in "drive mode" in the former case, and in "sense mode" in the latter case.

FIG. 3 illustrates three cross-sections of a bending piezoelectric transducer for out-of-plane-bending. The transducer includes a layer of piezoelectric material and two electrode layers deposited on a silicon suspender 31. The transducer has an oblong shape in the x-y-plane. The transducer includes a first electrode layer 34, a layer of piezoelectric material 32 and a second electrode layer 33. The layers 34, 32 and 33 together form a piezoelectric transducer. The silicon beam 31 bends out of the xy-plane when a drive voltage is applied to the electrodes. Conversely, a sense voltage signal can be read from electrode layers 33 and 34 if the suspender 31 is bent out of the xy-plane by an external force.

FIG. 4 illustrates three cross-sections of a bending piezoelectric transducer for in-plane-bending. This transducer includes a silicon beam 41 and a pair of first electrode layers 441 and 442, one on the upper side of the layer of piezoelectric material 42 and one on the lower side (up and down refers in this case to the direction of the z-axis). These electrodes are paired with second electrode layers 431 and 432, respectively, as illustrated in the figure. Layers 441, 42 and 431 together form a first piezoelectric transducer and layers 442, 42 and 432 together form a second piezoelectric transducer.

When drive voltages with opposite polarity are applied to the two transducers, the average y-axis strain is zero, so the transducer does not bend out of the xy-plane. However, the two transducers produce opposite strains in the xy-plane, which bends the silicon beam 41 within this plane. If the transducers are used as sense transducers, in-plane bending will generate a voltage differential between the two transducers, but out-of-plane bending will not.

The drawing conventions in FIGS. 3 and 4 will be employed throughout this disclosure to illustrate transducers for out-of-plane bending and in-plane bending, respectively. In other words, a single rectangle on a suspender will be used to indicate an out-of-plane transducer, while two parallel rectangles of opposite colour on a suspender will be used to indicate an in-plane transducer. These two parallel rectangles will primarily be referred to in the singular, as a single "in-plane transducer", even though the structure is actually a split construction comprising two transducers, as explained above. Grey and white colours on transducers indicate polarity.

The piezoelectric layer (32, 42), which may be an aluminium nitride (AlN) layer, is typically not thicker than a few micrometers. The thickness of the silicon beam (31, 41) may, for example, be 50 μm.

In MEMS resonators piezoelectric transducers typically cannot be attached directly to the inertial mass because it is too rigid. They may instead be coated on the springs or beams from which the inertial mass is suspended, as explained above. A piezoelectric transducer therefore transduces kinetic energy to or from the spring or beam, rather than to or from the inertial mass, as capacitive transducers typically do. This means that the dimensions of the suspenders become crucially important in piezoelectric resonators.

When a layer of piezoelectric material is bent by an external force, positive charges accumulate on one side of the layer and negative charges on the other. Periodically oscillating bending movements create an oscillating electric field, which can be measured as an alternating sense voltage signal from a sense transducer.

Document WO2011136972 discloses a piezoelectric rotational resonator where piezoelectric transducers are placed on suspenders which suspend an inertial mass from a central anchor point.

The suspenders which carry sense transducers do not necessarily bend with a uniform curvature along their entire length when the inertial mass is in resonance oscillation. The bending modes of a sense transducer depend on the resonance frequency of the resonator, on the dimensions of the suspender, and on how the suspender is attached to the oscillating inertial mass.

FIG. 5 illustrates how suspenders 231 and 232 bend in the prior art resonator depicted in FIG. 2 when the inertial mass 21 undergoes out-of-plane rotation about the x-axis and the suspenders are attached inflexibly at first and second attachment points 241, 242 and 251, 252. Inflexible attachment at second attachment points 251, 252 forces the outer ends of the suspenders 231 and 232 to move as guided ends. In other words, at second attachment points 251, 252 the suspenders 231 and 232 are impacted not only by the point load force which arises from the rotating inertial mass, but also by a bending moment load which maintains the suspender in a constant angle in relation to the inertial mass 21. This makes the suspenders 231 and 232 bend into an S-shaped form which creates a sign reversal of the surface stress of the suspender and thus a sign reversal of the charge between the sides of the corresponding transducers ⅔ of the way between attachment points 241, 242 and 251, 252 as illustrated in FIG. 5. The signs in FIG. 5 represent the sign of the surface stress along the suspender on each side of it. If the upper surface of the suspender is coated by the transducer the signs can also signify the sign of the charge at each side of the transducer. This is not an optimal bending mode because the sense voltage signal is lowered when charges of opposite sign cancel out in each sense electrode, and the signal to noise ratio will be lowered. The problem may be alleviated by coating one suspender with two separate sense transducers to counter the charge reversal, but this requires complicated contacting arrangements. Alternatively, only part of the suspender may be coated by the sense transducer, but this will cause loss of part of the generated charge and thus decreased the signal to noise ratio. The same problem occurs during in-plane rotation. Inflexibly attached suspenders 231 and 232 assume an S-shaped form in the xy-plane as the inertial mass rotates about the z-axis.

Another problem which arises from inflexible attachment and S-shaped bending is that the relationship between external force and suspender displacement becomes non-linear. In other words, the bending is not characterized by a single spring constant. In case of a drive transducer and high amplitude oscillation produced at resonance, the nonlinearity will lower the resonant frequency of oscillation when the amplitude is increased. This effect is undesirable in applications where frequency stability or frequency tracking between two resonators is aimed at, as is the case for reference oscillators and gyroscopic sensors. Also, the energy losses will increase and the effective Q-value will thus decrease due to the nonlinearity since part of the energy of the oscillation is irreversibly converted to higher harmonic frequencies.

A third problem with the state of the art suspender and attachment is the relatively high spring constant produced by the S-shape mode of bending of the suspender. It would be beneficial to reduce the spring constant for given spring dimensions because it would allow shrinking the device area to achieve the same resonant frequency with a smaller device. The first technical problem relating to suspender bending modes has been described above from the perspective of sense transducers. In other words, the inertial mass was assumed to produce the external force which bends the suspender in a certain manner. However, the same technical problem arises in drive transducers, because the inertial mass cannot be driven to oscillate in resonance unless the suspender assumes the bending mode which the resonance oscillation of the inertial mass dictates. When the oscillation of the inertial mass approaches and eventually reaches resonance, the bending of the suspender, and consequent charge accumulation, will be almost entirely dictated by this oscillation.

In other words, although the mechanical actuation of the drive transducer and the force arising from the resonating inertial mass always act together, and bend the suspender together, the force arising from the resonating inertial mass is by far the stronger determinant when the inertial mass oscillates in resonance. The bending mode must adapt to the resonating movement.

The technical problems outlined above have in part retarded the development of piezoelectric rotational resonators. Electrostatically driven and sensed resonators have predominated even though they require high bias voltages, consume more surface area than piezoelectric resonators and produce a capacitive output signal which is inversely proportional to the operating frequency. Piezoelectric transduction could improve the performance of a resonator on all of these counts, but suspender design becomes critical. It would be beneficial for the operation of both drive transducers and sense transducers if the resonant bending mode of the suspender would exhibit a more uniform charge distribution along the length of the transducer.

BRIEF DESCRIPTION OF THE DISCLOSURE

An object of the present disclosure is to provide an apparatus and method to alleviate the above disadvantages.

The objects of the disclosure are achieved by apparatuses which are characterized by what is stated in the independent claims. The preferred embodiments of the disclosure are disclosed in the dependent claims.

The disclosure is based on the idea of attaching suspenders to the inertial mass with at least one flexure, which allows the end of the suspender which is attached to the inertial mass to rotate in relation to the inertial mass at this attachment point when the inertial mass is in motion.

BRIEF DESCRIPTION OF THE DRAWINGS

The disclosure will be described in greater detail with reference to the accompanying drawings, in which
FIG. 8 illustrates three exemplary flexures.
FIG. 9 illustrates a flexure.
FIG. 10 illustrates the bending of a flexure when the inertial mass oscillates in-plane.
FIG. 11 illustrates the bending of a flexure when the inertial mass oscillates out-of-plane.
FIG. 15 illustrates a resonator for in-plane rotation.
FIG. 16 illustrates a resonator for out-of-plane rotation.
FIG. 17 illustrates a resonator for in-plane rotation.
FIG. 18 illustrates a resonator for out-of-plane rotation.
FIG. 20 illustrates a resonator with two pairs of suspenders.
FIG. 21 illustrates resonators comprising two suspenders of different width.
FIG. 22 illustrates resonators comprising two suspenders of different length.
FIG. 23a illustrates a resonator comprising an in-plane transducer on one suspender and an out-of-plane transducer on another suspender.
FIG. 23b illustrates a resonator comprising both an in-plane transducer and an out-of-plane transducer on each suspender.
FIG. 26 illustrates a gyroscope according to a first gyroscope embodiment.
FIG. 27 also illustrates a gyroscope according to a first gyroscope embodiment.

DETAILED DESCRIPTION OF THE DISCLOSURE

First Resonator Embodiment

Figure 2:
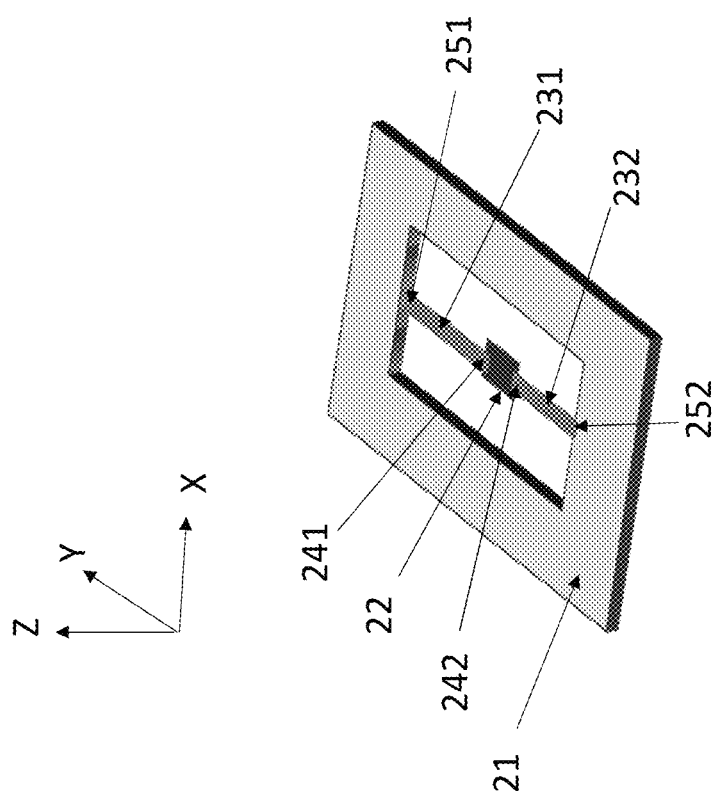
FIG. 2 illustrates a simple piezoelectrically driven resonator.
Figure 1:
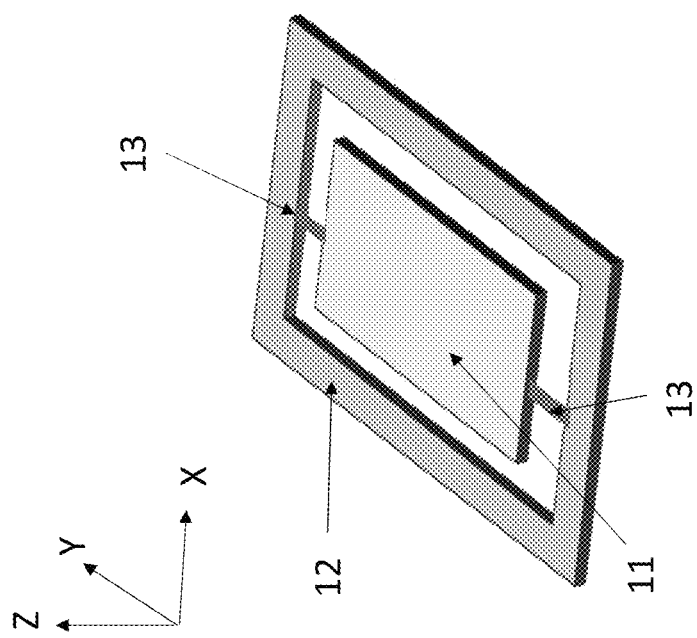
FIG. 1 illustrates a simple resonator.

In a first resonator embodiment, this disclosure relates to a rotational resonator comprising a substrate with at least one anchor point and an inertial mass with a first longitudinal end and a second longitudinal end. The inertial mass is suspended from the one or more anchor points by at least one suspender extending from the one or more anchor points toward the first longitudinal end of the inertial mass, and by at least one suspender extending from the same one or more anchor points toward the second longitudinal end of the inertial mass. Each suspender is attached from a first attachment point to its anchor point and from a second attachment point to the inertial mass. One or more suspenders are coated with a piezoelectric transducer structure configured to drive or detect oscillating rotary movement in the inertial mass. At least one coated suspender is attached from its second attachment point to the inertial mass with a flexure.

When piezoelectric transducers described in this disclosure are used in the sense mode, the best signal-to-noise ratios may be achieved when the transducer capacitance equals the sum of the capacitance of the external connections and the input capacitance of the amplifier, which usually amounts to a few pF. The capacitance of the transducer is determined by its area and by the thickness of the piezoelectric layer. It can be shown that if the piezoelectric layer is a 0.8 µm thick AlN layer, then the aspect ratio of the transducer in the xy-plane (in other words, its longitudinal length in the y-direction divided by its transversal breadth in the x-direction) should be in the range 10-30, preferably in the range 15-25, to achieve transducer capacitances in the range 2-5 pF at typical MEMS resonator frequencies (20-50 kHz) with an inertial mass whose aspect ratio (2-20, preferably 5-10) and thickness (20-50 µm) are in practical ranges. The required transducer area in the xy-plane will be approximately 0.05 mm² to achieve a 5 pF capacitance with a 0.8 µm thick AlN layer. This area may, for example, be obtained with dimensions of 1000 µm×50 µm. The piezoelectric transducers described in this disclosure, and the suspenders on which they are coated, therefore have oblong shapes with aspect ratios in the range 10-30, preferably 15-25.

The size and dimensions of the inertial mass may be chosen more freely because multiple suspenders can be attached to the mass if it is large, as illustrated in this disclosure. The inertial masses depicted in this disclosure also have oblong shapes, but their aspect ratio may be smaller than the aspect ratios of the transducers and suspenders. An inertial mass may have two longitudinal ends on two opposing sides of an anchor point. The longitudinal ends are separated in the y-direction by a longitudinal length. An inertial mass may also have two transversal sides on two opposing sides of an anchor point, separated in the x-direction by a transversal breadth. However, in some embodiments the inertial mass may be asymmetric, so that it only has one transversal side on one side of the anchor point.

Figure 6:
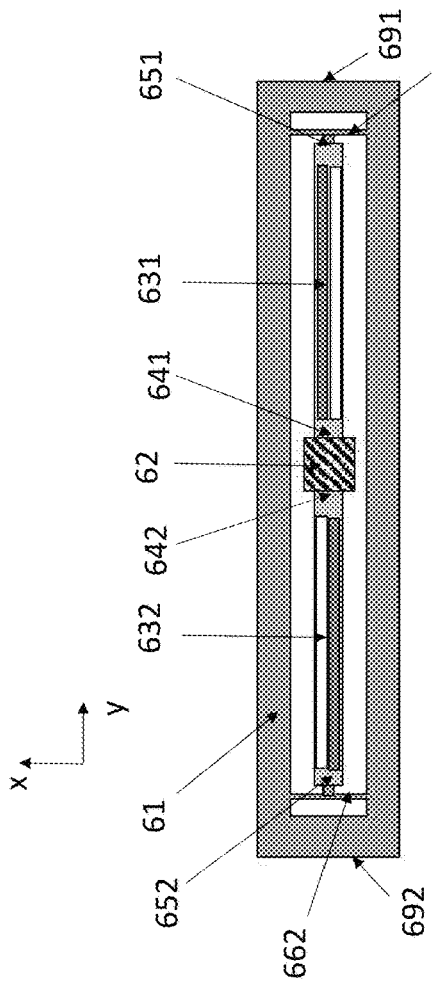
FIG. 6 illustrates a rotational resonator according to a first resonator embodiment.

FIG. 6 illustrates a rotational resonator according to this first resonator embodiment. The resonator includes an inertial mass 61 suspended from an anchor point 62 by two suspenders 631 and 632. The anchor point 62 is located within a central opening in the inertial mass. The suspenders 631 and 632 constitute a pair. The inertial mass has a first longitudinal end 691 and a second longitudinal end 692.

Figure 4:
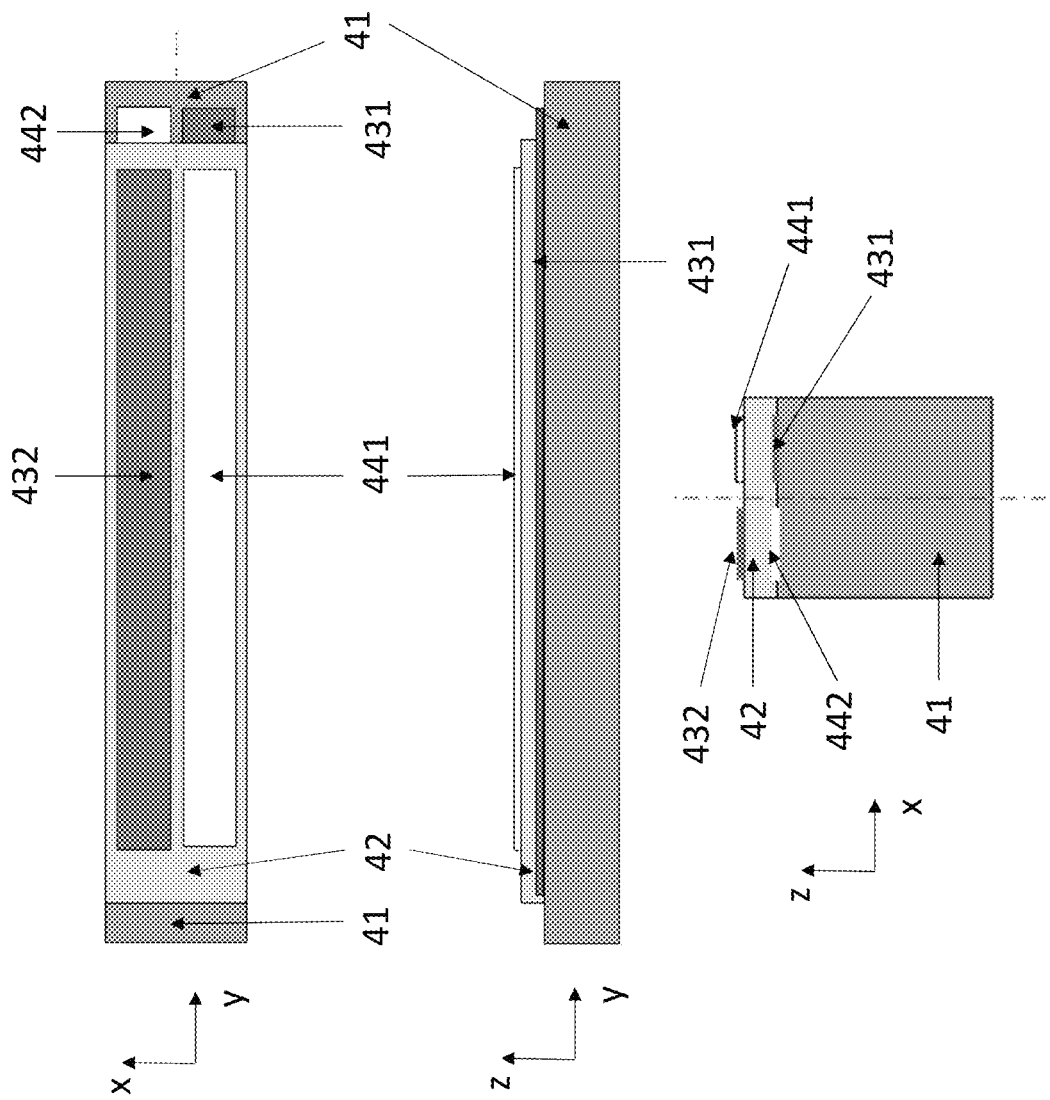
FIG. 4 illustrates an in-plane piezoelectric transducer on a suspender.

Each suspender 631, 632 is attached to the anchor point 62 from its first attachment point 641, 642. Each suspender 631, 632 is attached from its second attachment point 651, 652 to the inertial mass 61 with a flexure 661, 662. The piezoelectric transducers on the suspenders 631 and 632 are configured for in-plane rotation, in the manner illustrated above in FIG. 4.

Figure 7:
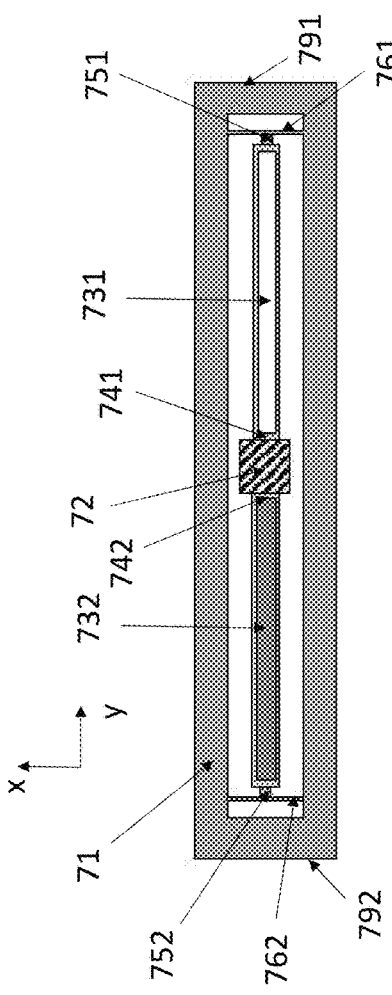
FIG. 7 also illustrates a rotational resonator according to a first resonator embodiment.

FIG. 7 illustrates a rotational resonator with the same components, where the piezoelectric transducers have been configured for out-of-plane rotation, in the manner illustrated above in FIG. 3. As illustrated by the colouring of the transducers on suspenders 731 and 732, the transducers have opposite polarity so that a voltage signal applied to them both will raise one end of the inertial mass 71 while lowering the other. Again, each suspender 731, 732 is attached to the anchor point 72 from its first attachment point 741, 742, and each suspender is attached from its second attachment point 751, 752 to the inertial mass 71 with a flexure 761, 762. The inertial mass has a first longitudinal end 791 and a second longitudinal end 792.

Figure 5:
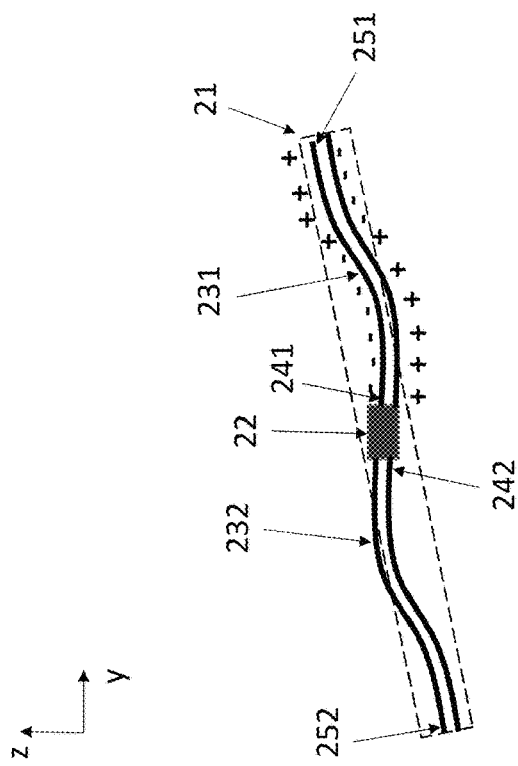
FIG. 5 illustrates the bending mode of a prior art suspender when the inertial mass oscillates in resonance.

The term "flexure" refers to an etched silicon structure which is sufficiently flexible to absorb, by bending or twisting, the bending moment acting between the inertial mass and the second attachment point. In other words, flexures 661, 662 and 761, 762 reduce the bending moment between the second attachment points 651, 652 and 751, 752 and the inertial masses 61 and 71, respectively, approximately to zero. Flexures thereby reduces the charge distribution disparity between the two sides of the sense transducer by removing the sign reversal of the surface stress and thus that of the charge, which was illustrated in FIG. 5.

The height of a flexure in the z-direction may be designated $Z_F$. This height may equal the thickness of the inertial mass and the suspenders. In some practical configurations, these heights are on the order of 50 µm.

$X_F$ denotes here the length of the flexure in the x-direction. FIG. 8 illustrates three exemplary flexures. The flexure 861 spans the breadth of the central opening in the inertial mass 811. The flexure 862 spans half of the breadth of the central opening in the inertial mass 812. The flexure 863 has a meandering shape with a length $X_F$ which exceeds half of the breadth of the central opening in the inertial mass 813. The width of the central opening in an inertial mass near the attachment point may, for example, be 30-70% of the width of the inertial mass 811, 812, 813. $Y_F$ is the breadth of the flexible spring in the y-direction. Any of the flexures presented in FIG. 8 can be employed in the embodiments presented below.

The thickness $Z_F$ of flexures makes them stiff for translational movement out of the xy-plane. Their narrow breadth $Y_F$ allows them to flex in the xy-plane when the in-plane bending of the suspenders 631 and 632 is transmitted to the inertial mass through second attachment point 651, 652 (or vice versa), and to twist torsionally about the x-axis when the out-of-plane movement of the suspenders 731 and 732 is transmitted to the inertial mass through second attachment points 751, 752 (or vice versa).

In other words, the flexures are stiff for translational movement out of the mass plane but flexible for bending in the mass plane, and flexible for torsional twisting about an axis which is parallel to the lengthwise direction of the flexure.

The $Z_F/Y_F$ and $X_F/Y_F$ aspect ratios determine to what extent the flexure can absorb the bending moment at the second attachment point. Large aspect ratios facilitate easy bending and twisting, but $Y_F$ must remain sufficiently large to be easy to manufacture and to allow the flexure to withstand the mechanical strain which arises in the bending and twisting. The aspect ratios therefore have both optimal lower and upper limits.

In the case of the meandering flexure 863 in FIG. 8, the relevant aspect ratios may be calculated as $Z_F/Y_F$ and $\Sigma X_F/Y_F$, where $\Sigma X_F = X_{F1} + X_{F2} + X_{F3}$ . . . is the sum of the lengths of all components of the meandering flexure in the x-direction.

The $Z_F/Y_F$ aspect ratio will in this disclosure be called height/breadth aspect ratio, and the $X_F/Y_F$ and $\Sigma X_F/Y_F$ aspect ratios will be called length/breadth aspect ratios.

Partial absorption of the bending moment at the second attachment point may be achieved when the height/breadth and length/breadth aspect ratios equal to 2. Almost complete absorption of the bending moment may be achieved when the height/breadth and length/breadth aspect ratios are greater than 4. The height/breadth aspect ratio can be increased up to 10 without compromising manufacturability or stress durability. The length/breadth aspect ratio doesn't have such a manufacturing limit or strength limit but here the rule is that the length must be much less than the suspension length so that the total spring coefficient is not influenced. The height/breadth aspect ratio greater than 10 will absorb all the bending moment at the second attachment point, but the manufacturability suffers and stress durability becomes weaker, and it may cause yield loss and decrease of the shock resistance.

The mechanics of flexing and twisting movement in the flexures depend on their dimensions and on the dimensions of the second attachment points. This is illustrated schematically in FIGS. 9-11, where the flexure 861 in FIG. 8 has been drawn. In this case the flexure 861 is as thick as the inertial mass in the z-direction, so second attachment point extends in the z-direction from point 851 to 852, while the flexure 861 is attached to the inertial mass 811 from 881 to 882 and from 871 to 872. 89 is an optional narrow silicon bridge at the end of the suspender 831. The suspender 831 could also be attached to the flexure along its entire breadth, without a narrow bridge.

FIG. 10 illustrates schematically the bending of the flexure 861 when the inertial mass undergoes in-plane rotation, viewed in the xy-plane. The width of the second attachment point has been exaggerated to improve clarity, and the angle of rotation indicated in FIG. 10 is for the same reason much larger than the angle an inertial mass would normally obtain in a MEMS resonator. The flexure 861 remains attached to the moving inertial mass at points 871-872 and 881-882, but bends at the middle so that no bending moment is transferred from the inertial mass to the second attachment point 851-852 and onward to the suspender 831.

FIG. 11 illustrates schematically the bending of the flexure 861 when the inertial mass has undergone out-of-plane rotation clockwise about the x-axis, viewed from the same angle as in FIG. 9. The flexure 861 becomes torsionally twisted about the x-axis, so that the upper part 851 of the second attachment point and the lower part 852 moves in different directions on the y-axis. At both ends of the flexure 861, the upper corners 871, 881 of the flexure remain aligned with the lower corners 872, 882. The angle of rotation indicated in FIG. 11 is larger than the rotation angle an inertial mass would normally obtain in a MEMS resonator. The flexure 861 twists at the middle, so that no bending moment is transferred from the inertial mass to the second attachment point 851-852 and onward to the suspender 831. The suspender 831 is illustrated with an in-plane transducer in FIG. 8, but it would be coated with an out-of-plane transducer when that is the intended rotation mode.

Figure 12:
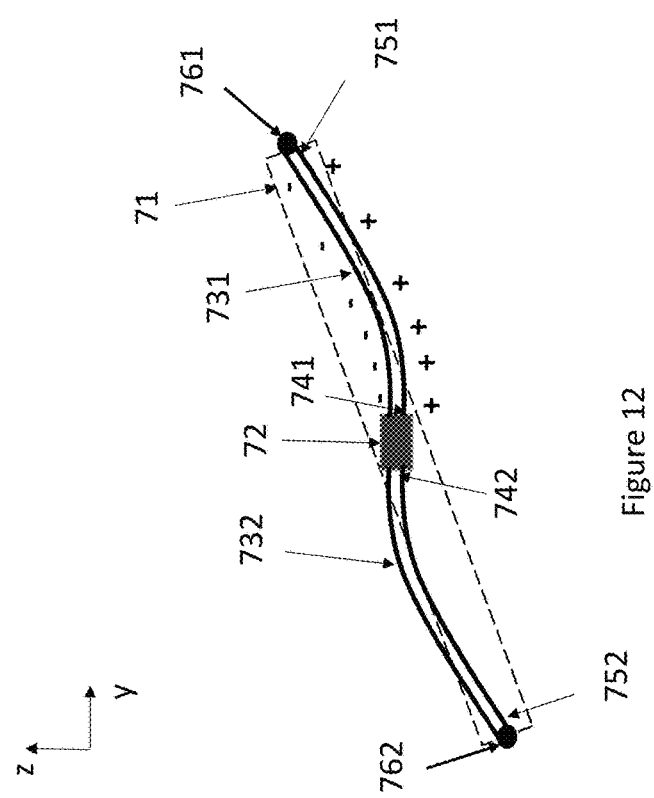
FIG. 12 illustrates the bending mode of a suspender which is attached to the inertial mass with a flexure when the inertial mass oscillates in resonance.

The technical effect of torsional twisting in flexure 761, 762 is illustrated in FIG. 12. For reasons of clarity the flexures 761, 762 have been illustrated only with a black dot and the suspenders 731, 732 have been drawn relatively thin, even though both flexures and suspenders may in reality be as thick as the inertial mass 71 in the y-direction. The torsional twist in the flexures 761, 762 allows the suspenders 731 to assume a shape where the curvature is in the same direction along the entire length of the suspenders.

Consequently, the surface stress on the suspender and thus the accumulated charge on either side of the transducer has the same sign along the entire length of the suspender. This allows the inertial mass to be driven more effectively, and it conversely allows a stronger sense signal to be detected in the sense mode with simplified transducer geometry. The transducer is strongly coupled to the bending mode of the suspender for most of its length, and the suspender oscillation is linear even in large displacements. Linearity facilitates an increase in the oscillation amplitude of the inertial mass without increased mechanical losses or a change in oscillation frequency.

The "+" and "−" signs of FIG. 12 indicate the sign of the surface stress on each side of the suspender. The signs indicate also the sign of the charge distribution, as in FIG. 5. It has been illustrated across the entire thickness of the suspender for reasons of clarity, but in reality the charge distribution only extends across the thickness of the transducer.

The advantages obtained with the apparatus of this disclosure include a suspender charge distributions which exhibits no sign reversal along the length of the suspender, suspender bending modes with low spring constants, and consequently high piezoelectric transducer capacitances and small size of the resonator at a given resonant frequency. In gyroscope and clock oscillator applications these benefits facilitate small motional resistance, high coupling factors, reliable and fast startup of the oscillation and high signal-to-noise ratios in the sense voltage signal. The flexures also facilitate stress relief in the suspenders because they flex in the lengthwise direction of the suspender (in the y-direction in FIG. 12), which greatly improves the linearity of the resonator.

The same surface stress, charge distribution, stress relief and linearity considerations apply to the resonator and suspenders in FIG. 6 when the inertial mass 61 is driven into in-plane rotation about the z-axis.

Figure 13:
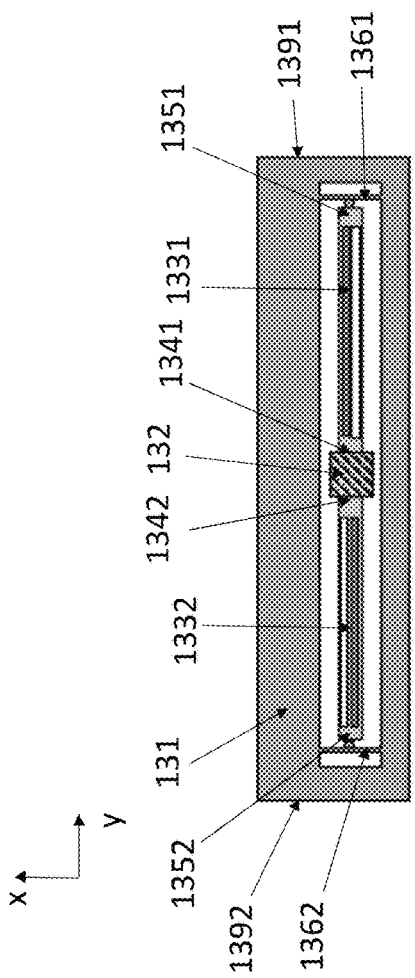
FIG. 13 illustrates a resonator for in-plane rotation.
Figure 14:
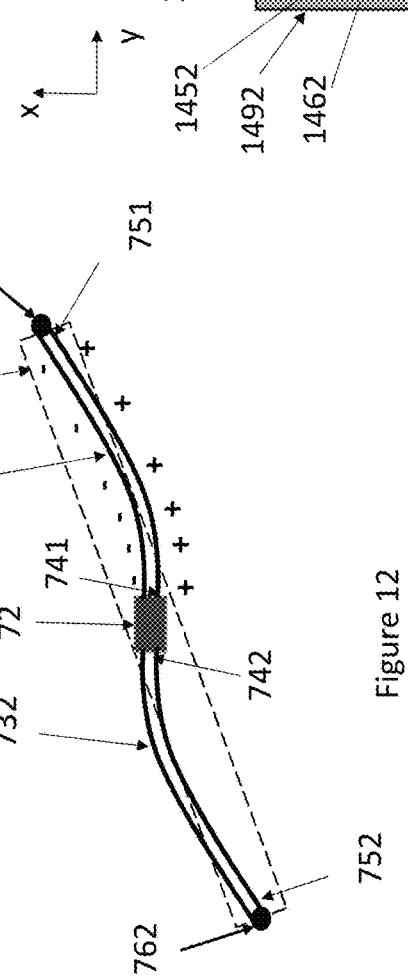
FIG. 14 illustrates a resonator for out-of-plane rotation.

As illustrated graphically in FIG. 12, the charge density in the transducer may be higher close to the first attachment point 741 than it is near the second attachment point 751 in the illustrated bending mode. This occurs when the suspender 731 bends with a larger curvature close to the first attachment points than it does close to the second attachment points. It may for this reason be beneficial to shorten the transducers so that they cover, for example, 50-70% of the length of the suspender, starting from the end which is closer to the first attachment points. In other words, the piezoelectric transducer structure on at least one coated suspender may extend along the suspender from the first attachment point to a point whose distance from the first attachment point corresponds to 50-70% of the length of suspender The flexures between suspenders and inertial masses may be implemented with inertial masses of different shapes. The center of gravity of the inertial mass may preferably be located on the desired rotational axis, but this is not an absolute requirement. FIG. 13 illustrates a resonator for in-plane rotation where the center of gravity has been displaced from the from the suspenders 1331, 1332 and the anchor point 132 in the direction perpendicular to the longitudinal axis. FIG. 14 illustrates a similar resonator for out-of-plane rotation. Reference numbers 131-132, 1331-1332, 1341-1342, 1351-1352, 1361-1362, 1391-1392, 141-142, 1431-1432, 1441-1442, 1451-1452, 1461-1462 and 1491-1492 illustrate the same elements as numbers 61-62, 631-632, 641-642, 651-652, 661-662, 691-692, 71-72, 731-732, 741-742, 751-752, 761-762 and 791-792 in FIGS. 6 and 7, respectively.

The anchor point does not coincide with the center of gravity in the resonators depicted in FIGS. 13 and 14. The inertial mass has a central opening where the anchor points and the suspenders are located. The center of gravity lies on the axis of rotation in the resonator illustrated in FIG. 14, but not in the resonator illustrated in FIG. 13. A linear translation will therefore be superimposed on the oscillating motion of the resonator illustrated in FIG. 13. Although it is generally preferable that the inertial mass be symmetric and that the center of gravity lie on the axis of rotation, reasons relating to area minimization or to other components lying in close proximity to the resonator may sometimes make asymmetric constructions, such as the ones in FIGS. 13 and 14, more preferable.

Other alternative asymmetric shapes are illustrated in FIGS. 15 and 16, where reference numbers 151-152, 1531-1532, 1541-1542, 1551-1552, 1561-1562, 1591-1592, 161-162, 1631-1632, 1641-1642, 1651-1652, 1661-1662 and 1691-1692 again illustrate the same elements as numbers 61-62, 631-632, 641-642, 651-652, 661-662, 691-692, 71-72, 731-732, 741-742, 751-752, 761-762 and 791-792 in FIGS. 6 and 7, respectively. Inertial masses 151 and 161 are asymmetrical since they only comprise one transversal side 150, 160 on one side of the anchor point. The anchor point can be made to coincide with the center of gravity by extending the longitudinal ends in the negative x-direction.

Further alternative shapes are illustrated in FIGS. 17 and 18, where reference numbers 171-172, 1731-1732, 1741-1742, 1751-1752, 1761-1762, 1791-1792, 181-182, 1831-1832, 1841-1842, 1851-1852, 1861-1862 and 1891-1892 again illustrate the same elements as numbers 61-62, 631-632, 641-642, 651-652, 661-662, 691-692, 71-72, 731-732, 741-742, 751-752, 761-762 and 791-792 in FIGS. 6 and 7, respectively. These resonators illustrate arbitrary shapes where the center of gravity coincides with the anchor points 172 and 182. The inertial masses 171 and 181 have protrusions in each corner, which increase the size of the inertial mass. Symmetry in relation to the anchor points 172 and 182 means that the centers of gravity still lie at the anchor points. The axes of rotation also pass through the center of gravity.

Any of the variously shaped flexures and inertial masses exemplified above can be employed in any of the embodiments described in this disclosure.

Second Resonator Embodiment

In a second resonator embodiment, the inertial mass in the rotational resonator is suspended from at least one anchor point by three or more suspenders. As in the first resonator embodiment, the suspenders are attached from first attachment points to at least one anchor point, and at least one of the suspenders is coated with a piezoelectric transducer structure configured to drive or detect the oscillating rotary movement of the inertial mass. Flexures attach the second attachment points of the coated suspenders to the inertial mass.

Increasing the number of suspenders coated with piezoelectric transducer structures allows increasing the size of the inertial mass by making it wider. With two suspenders, as e.g. in FIG. 7, the rotational inertia around the longitudinal axis of the suspender would increase by widening the inertial mass and the resonant frequency of the perpendicular out-of-plane mode would become lower and it could interfere with the intended operation of the resonator. By three or more suspenders, having some in-plane separation between them, the effective spring constant for this mode can be made much higher and thus the disturbing effect can be alleviated. Increasing the number of suspenders coated with piezoelectric transducer structures also increases the actuation amplitude when the transducers are used for driving the resonator, and conversely strengthens the signal when the transducers are used for sensing the oscillation in the resonator.

Increasing the number of suspenders to more than two is only practical for out-of-plane resonators, since the in-plane separation between the suspenders will make the spring constant for the in-plane rotary mode very large.

Figure 19:
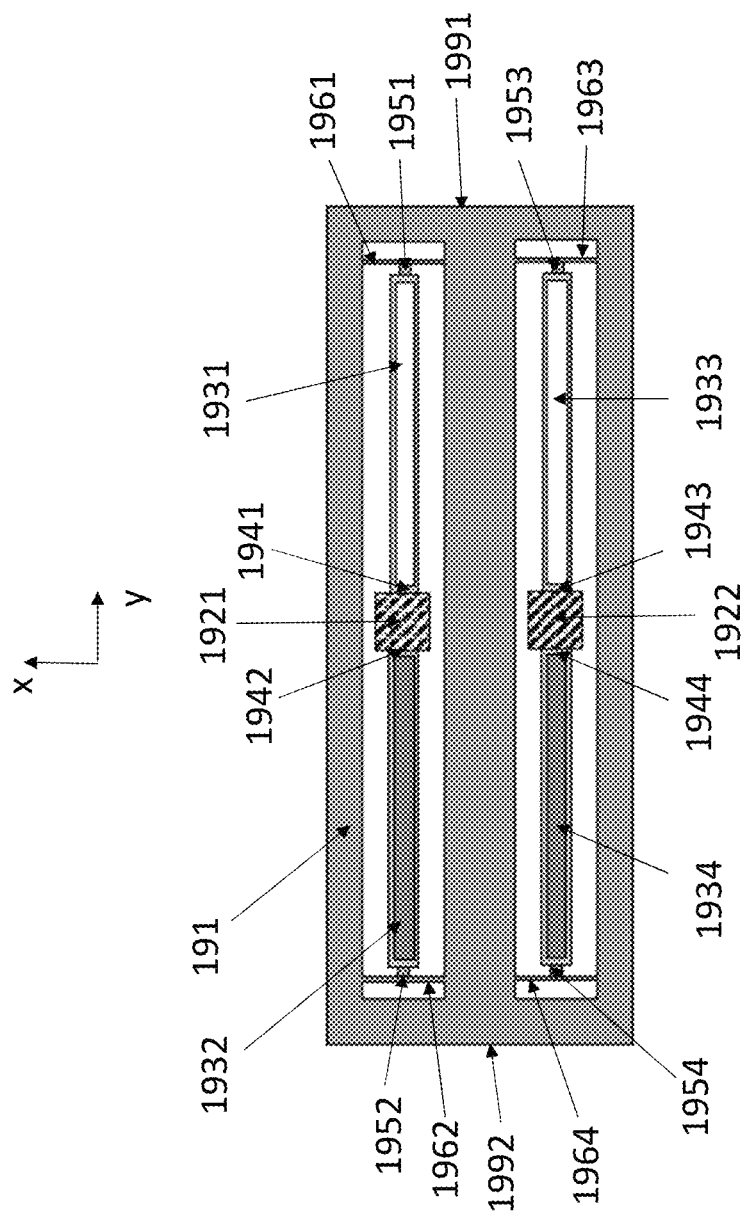
FIG. 19 illustrates a resonator with two pairs of suspenders.

FIG. 19 illustrates one implementation of the second resonator embodiment. The inertial mass 191 may comprise two openings where two anchor points 1921 and 1922 are located. In this example, four suspenders 1931, 1932, 1933 and 1934, coated with piezoelectric transducer structures, suspend the inertial mass 191 from the anchor points 1921 and 1922. Suspenders 1931 and 1932 constitute one pair, and suspenders 1933 and 1934 constitute another pair. As in the other resonator embodiments, although all suspenders are coated in FIG. 19, the embodiment may also be implemented by coating only one or some of the suspenders. Every attachment point 1941-1944 and 1951-1954 in FIG. 19 may be implemented in any manner which was described in the first resonator embodiment. The inertial mass has first and second longitudinal ends 1991 and 1992.

FIG. 20 illustrates an alternative implementation of the second resonator embodiment where the inertial mass 201 comprises only one opening with one anchor point 202. In this example, four suspenders 2031-2034 again extend from the anchor point 202 to the inertial mass 201 and constitute two pairs. However, in this configuration the number of suspenders could also be two on a first side of anchor point 202, and one on a second side of the anchor point 202. If only one suspender is used either the first or the second side, then this suspender may be wider in the x-direction than either of the two suspenders on the other side. The number of suspenders may be increased to any odd or even number with corresponding modifications. Every attachment point 2041-2044, 2051-2054 and flexure 2061-2064 in FIG. 20 may be implemented in any manner described in the first resonator embodiment. The inertial mass has first and second longitudinal ends 2091 and 2092.

Figure 3:
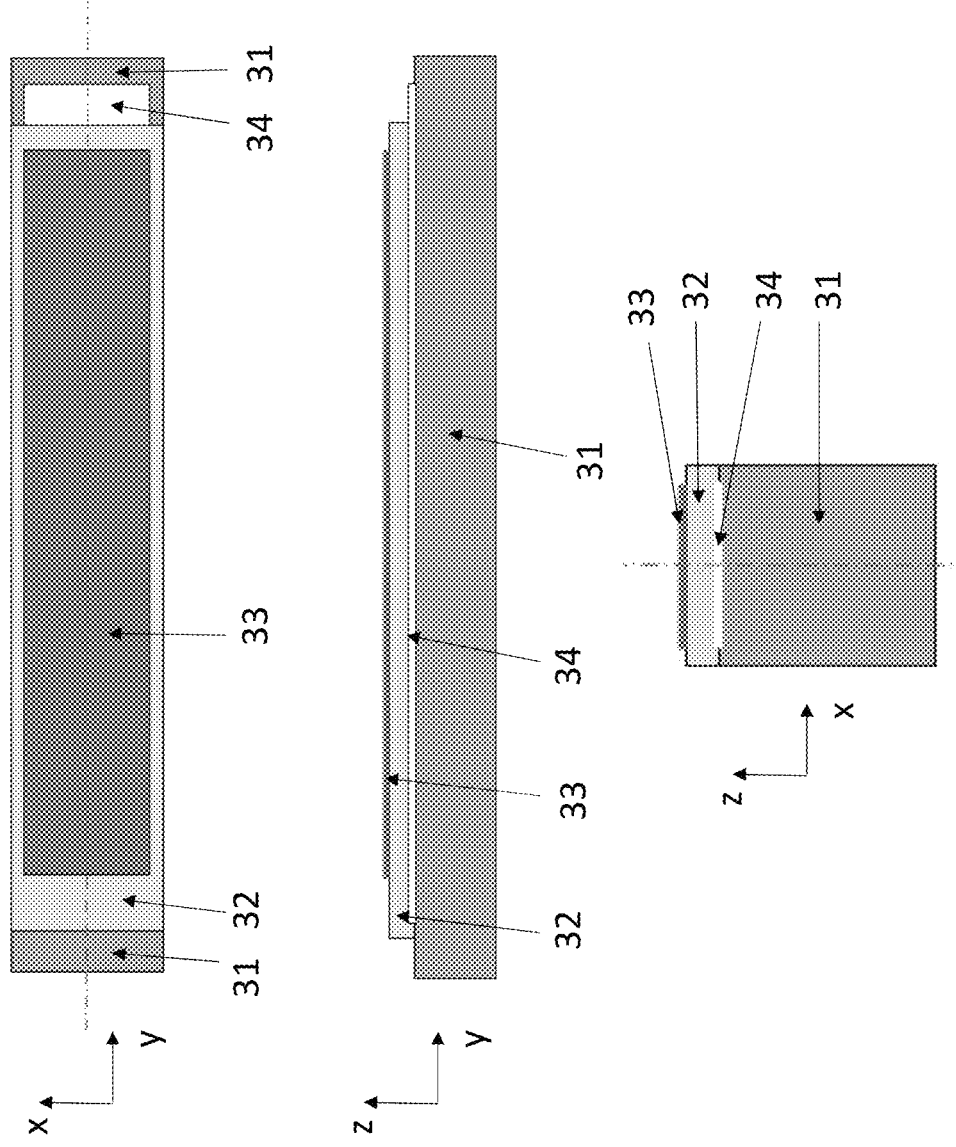
FIG. 3 illustrates an out-of-plane piezoelectric transducer on a suspender.

The piezoelectric transducers illustrated in FIGS. 19 and 20 may drive and/or detect out-of-plane bending, as indicated by the colourings which correspond to FIG. 3. Structures with multiple suspenders on at least one side of an anchor point are typically too rigid for in-plane rotational resonance at low frequencies.

Third Resonator Embodiment

In a third resonator embodiment, the length of at least one piezoelectric transducer structure on a coated suspender extending from an anchor point toward the first longitudinal end of the inertial mass differs from the length of at least one piezoelectric transducer structure on a coated suspender extending from the same anchor point toward the second longitudinal end of the inertial mass, or the width of at least one piezoelectric transducer structure on a coated suspender extending from an anchor point toward the first longitudinal end of the inertial mass differs from the width of at least one piezoelectric transducer structure on a coated suspender extending from the same anchor point toward the second longitudinal end of the inertial mass. The suspenders are attached from first attachment points to at least one anchor point, and at least two of the suspenders are coated with a piezoelectric transducer structure configured to drive or detect the oscillating rotary movement of the inertial mass. Flexures attach the second attachment points of the coated suspenders to the inertial mass.

In the two preceding resonator embodiments, the anchor point was located approximately at the center of gravity of the inertial mass, and/or at the combined center of gravity of the entire resonator, with suspenders and other structures included. The rotational axis also passed through the center of gravity in the two preceding embodiments. However, the anchor point may also be placed away from the center of gravity of the resonator while retaining the axis of rotation at the center of gravity. This is accomplished in this third resonator embodiment by implementing suspenders with different spring constants on the two opposing sides of the resonator.

FIG. 21 illustrates two implementations of the third resonator embodiment, one for in-plane bending and one for out-of-plane bending. The center of gravity is in this case located on one side of the anchor point 212 and the suspenders and transducers may be wider on that side of the anchor point than on the opposite side. The suspenders 2131 and 2132 constitute a pair. In both resonators, the suspender 2131 to the right of the anchor point 212 is wider in the x-direction than the suspender 2132 to the left of the anchor point 212. There may be a corresponding difference in the dimensions of the transducers coated on the suspenders. The width difference leads to a difference in spring constants and transduction strength in the suspenders and transducers. With suitably selected widths, the illustrated resonators may be brought to rotational oscillation about axes which pass through their center of gravity even though the center of gravity does not coincide with the anchor point. Rotation axes are indicated with dotted lines in FIG. 21 (in the upper resonator the rotation axes is parallel to the y-axis). In other words, transducers of different width facilitate balanced rotation of an asymmetrical inertial mass in relation to a rotation axis which does not pass through the anchor point.

Another way of implementing the third resonator embodiment is illustrated in FIG. 22. In both resonators, the suspender 2231 to the right of the anchor point 222 is shorter in the y-direction than the suspender 2232 to the left of the anchor point 222. There may be a corresponding difference in the dimensions of the transducers coated on the suspenders. The length difference leads to a difference in spring constants and transduction strength in the suspenders and transducers on the two sides of the resonator. With suitably selected lengths, the illustrated resonators can be brought to rotational oscillation about axes which pass through their center of gravity even though the anchor point does not lie at the center of gravity. Rotation axes are indicated with dotted lines in FIG. 22 (in the upper resonator the rotation axes is parallel to the y-axis). In other words, transducers of different length facilitate balanced rotation of an asymmetrical inertial mass in relation to a rotation axis which does not pass through the anchor point.

The third embodiment may be combined with the second embodiment, so that multiple transducers are implemented on one side of the anchor point with a certain length/width, and one or more transducers are implemented on the other side with a different length/width.

Fourth Resonator Embodiment

In a fourth resonator embodiment, each transducer on a coated suspender extending from an anchor point toward the first longitudinal end of the inertial mass is configured for in-plane bending, and each transducer on a coated suspender extending from an anchor point toward the second longitudinal end of the inertial mass is configured for out-of-plane bending. Alternatively, each coated suspender may be coated with one piezoelectric transducer structure configured for in-plane bending and one piezoelectric transducer structure configured for out-of-plane bending. The suspenders are attached from first attachment points to at least one anchor point, and flexures attach the second attachment points of the coated suspenders to the inertial mass.

With these arrangements, a piezoelectric rotational resonator can be actuated to oscillate simultaneously in the in-plane and the out-of-plane mode. The in-plane and out-of-plane transducers may be placed on separate suspenders, as illustrated in FIG. 23a, or on the same suspender, as illustrated in FIG. 23b. In FIG. 23a a transducer for out-of-plane oscillation has been coated on suspender 2331 and a transducer for in-plane oscillation has been coated on suspender 2332. In FIG. 23b one transducer of each kind has been coated on each suspender 2333 and 2334. In each figure, inertial mass 231 has a first longitudinal end 2391 and a second longitudinal end 2392.

The resonance frequencies of the in-plane and out-of-plane oscillation modes depend at least on the thickness and width of the suspenders. If the suspender thickness and width are equal on both sides of the anchor point 232, then the resonance frequencies are usually also approximately equal. However, there may be slight deviations due to the behaviour of the flexures 2361-2364 in each oscillation mode. Detected deviations in the resonance frequencies of the two oscillation modes may be compensated with small adjustments to suspender width and thickness so that the resonance frequencies become equal.

First Resonator System Embodiment

In a first resonator system embodiment, a rotational resonator system comprises a substrate with at least a first anchor point and a second anchor point, and first and second inertial masses which are mechanically coupled to each other. The first inertial mass is suspended from the first anchor point by at least a first suspender and a second suspender, and the second inertial mass is suspended from the second anchor point by at least a third suspender and a fourth suspender. The first and third suspenders extend from their respective anchor points towards a first longitudinal end of the resonator system, and the second and fourth suspenders extend from their respective anchor points towards a second longitudinal end of the resonator system. The first and second suspenders are attached from their first attachment points to the first anchor point, and the third and fourth suspenders are attached from their first attachment points to the second anchor point. At least one of the suspenders is coated with a piezoelectric transducer structure configured to drive or detect oscillating rotary movement in the inertial mass to which it is attached, and at least one of the coated suspenders is attached from its second attachment point to either the first or the second inertial mass with a flexure.

Resonators with a single inertial mass are susceptible to disturbances arising from external vibrations. Rotational resonators are insensitive to linear external vibrations but are still susceptible to rotary vibrations. They may also suffer from acoustic losses due to mechanical coupling between the inertial suspender and the fixed base of the resonator. This coupling is due to the torque exerted by the suspenders on the anchor point and thus on the fixed base, which in practice will not be totally fixed but have a large but not infinite mass and thus a finite moment of inertia. If the fixed base is able to rotate even slightly, energy will leak out from the resonator and may be converted to heat if the support of the fixed base is attached by glue or other acoustically dissipative material or it is attached to an acoustically dissipative material such as plastic or composite material. The effect will be a lowered and greatly variable Q-value of the resonator, depending on the properties of the materials of attachment. These problems may be circumvented in resonator systems which include two inertial masses. The two inertial masses may be mechanically coupled to each other to oscillate synchronously. Increased robustness and decreased losses may be obtained by driving the two inertial masses into anti-phase oscillation, where at any given time one mass rotates clockwise about a given axis when the other rotates at equal angular velocity counter-clockwise about a parallel axis, and vice versa. The torques exerted by the two resonators on the fixed base will then be equal but opposite, and will cancel each other. The same benefits may be obtained on the sense side by reading a differential signal from the piezoelectric transducers. The effect of external vibrations on each resonator will be equal and by differential reading they will cancel each other.

Figures 24A, 24B:
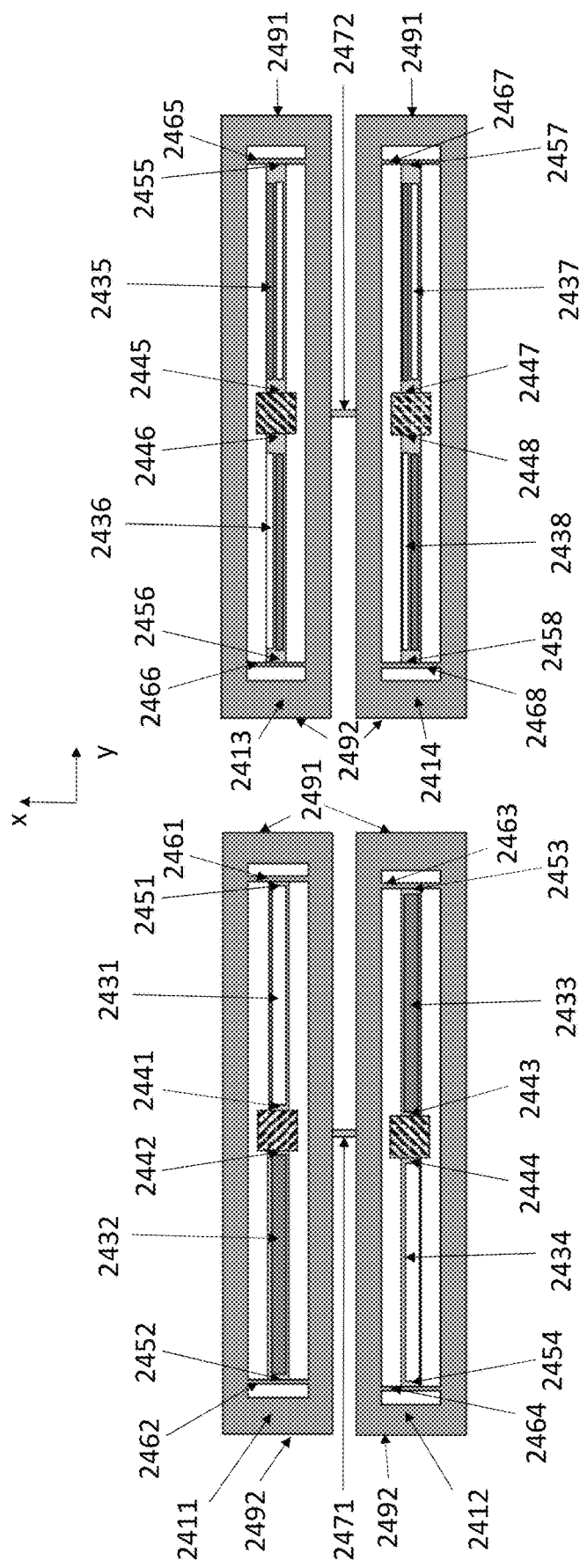
FIG. 24a illustrates a resonator system configured for out-of-plane oscillation.
FIG. 24b illustrates a resonator system configured for in-plane oscillation.

FIGS. 24a and 24b illustrate two resonator systems. Each resonator system has a first longitudinal end 2491 and a second longitudinal end 2492. The one in FIG. 24a is configured for out-of-plane oscillation. First and fourth suspenders 2431 and 2434 have been coated with transducers of one polarity while second and third suspenders 2432 and 2433 have been coated with transducers of the opposite polarity. The two inertial masses 2411 and 2412 may be mechanically coupled to each other and synchronized, for example, with a single torsion spring 2471. Other coupling mechanisms may also be used. When all transducers are driven with the same drive voltage signal, this transducer setup will induce anti-phase oscillation in the two inertial masses 2411 and 2412, so that one mass rotates clockwise about the x-axis when the other rotates counter-clockwise, and vice versa. A differential sense voltage signal can then be read from the transducers. Alternatively, if the first and third suspenders 2431 and 2433 would be coated with transducers of one polarity, while second and fourth suspenders 2432 and 2434 have been coated with transducers of the opposite polarity, then the two inertial masses 2411 and 2412 may be driven into anti-phase oscillation by applying to the transducers on the first and second suspenders a drive voltage signal which is separated by a 180° phase difference from the signal applied to the transducers on the third and fourth suspenders.

Conversely, the resonator system in FIG. 24b is configured for in-plane oscillation. Transducers have been coated in one order on the first and third suspenders 2435 and 2437, and in the opposite order on second and fourth suspenders 2436 and 2438. The two inertial masses 2413 and 2414 may be mechanically coupled to each other and synchronized, for example, with a single bending spring 2472. With appropriately selected drive voltages, one mass will oscillate clockwise about the z-axis when the other rotates counter-clockwise, and vice versa. All four suspenders may also be coated with transducers in the same order if drive voltages are adjusted accordingly.

Any resonator and flexure configuration described in the preceding resonator embodiments can be implemented in the first and second resonator system embodiments.

Second Resonator System Embodiment

The resonators in a resonator system may also be mechanically coupled to each other and synchronized with more complex interconnection structures, for example to suppress common-mode oscillation where both resonators oscillate in the same phase.

In a second resonator system embodiment, the two inertial masses are mechanically coupled and synchronized with a spring system which comprises a third anchor point between the first and second inertial masses, a first longitudinal spring extending from the third anchor point to a first transversal bar, a second longitudinal spring extending from the first transversal bar to the first inertial mass, and a third longitudinal spring extending from the first transversal bar to the second inertial mass. The spring system may also comprise a fourth anchor point between the first and second inertial masses, a fifth longitudinal spring extending from the fourth anchor point to a second transversal bar, a sixth longitudinal spring extending from the second transversal bar to the first inertial mass, and a seventh longitudinal spring extending from the second transversal bar to the second inertial mass.

Figure 25:
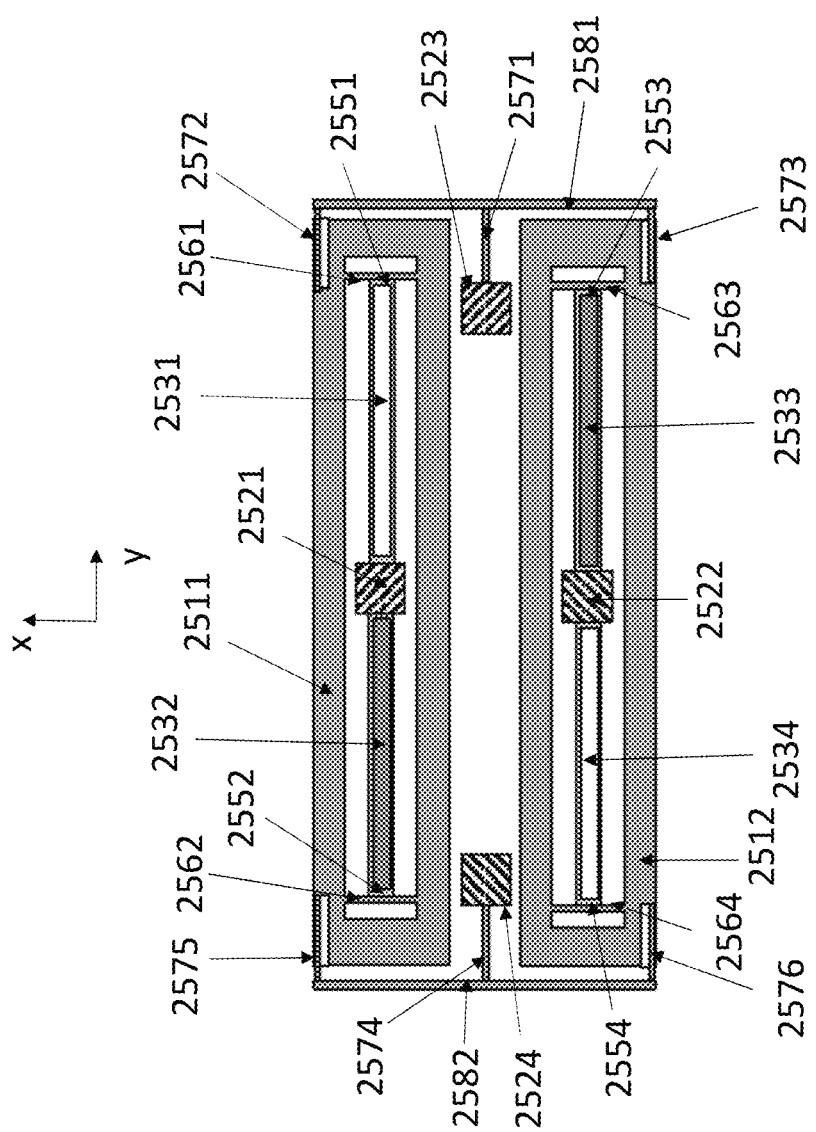
FIG. 25 illustrates a resonator system where alternative mechanical coupling.

FIG. 25 illustrates a resonator system according to this second embodiment. The spring system may comprise structures at only one longitudinal end of the resonator system, or at both ends. The latter alternative is illustrated in FIG. 25.

A first inertial mass 2511 is suspended from a first anchor point 2521 from first and second suspenders 2531 and 2532. A second inertial mass 2512 is suspended from a second anchor point 2522 from third and fourth suspenders 2533 and 2534. The suspenders may be attached from their second attachment points 2551-2554 to the first inertial mass 2511 and second inertial mass 2512 via flexures 2561-2564, as in the preceding embodiments.

In this case the spring system comprises additional central anchor points 2523 and 2524, to which one end of first and fourth longitudinal springs 2571 and 2574 may be attached, as illustrated in FIG. 25. The other end of the first and fourth longitudinal springs 2571 and 2574 may be attached to first and second transversal bars 2581 and 2582, respectively. A second longitudinal spring 2572 may be attached from one end to the first transversal bar 2581 and from its other end to the first inertial mass 2511. A third longitudinal spring 2573 may be attached from one end to the first transversal bar 2581 and from its other end to the second inertial mass 2512. A fifth longitudinal spring 2575 may be attached from one end to the second transversal bar 2582 and from its other end to the first inertial mass 2511. A sixth longitudinal spring 2576 may be attached from one end to the second transversal bar 2582 and from its other end to the second inertial mass 2512.

The second, third, fifth and sixth longitudinal springs 2572-2573 and 2575-2576 may be attached to the side of the inertial masses 2511-2512 which lies opposite to the third and fourth anchor points, respectively. This is illustrated in FIG. 25. Alternatively, the second, third, fifth and sixth longitudinal springs 2572-2573 and 2575-2576 may be attached to the inertial masses 2511-2512 closer to the longitudinal middle line of each inertial mass.

The springs 2571-2576 and the transversal bars 2581-2582 are narrow in one direction, as illustrated in the Figure. The higher their aspect ratio, the more efficient the suppression of the common mode. High aspect ratios are also preferable because synchronization will affect the total spring constant of the desired oscillation modes less when the aspect ratio is high. The aspect ratio of the springs and the transversal bar may preferably be in the range 8-12, but even an aspect ratio of 3.4 suppresses common mode oscillation significantly without changing the spring constant by more than 10%.

The longitudinal springs 2571-2576 may have flexibility for in-plane bending and twisting about the y-axis, but are stiff for out-of-plane bending. The transversal bars 2581-2582 may be stiff for all bending and twisting modes, but it may also be given some flexibility for in-plane bending. Flexibility for in-plane bending may be needed especially if the points of attachment of springs 2572-2573 and 2575-2576 do not lie on the longitudinal middle line of each inertial mass. Flexibility in the transversal bar may also improve the linearity of the in-plane spring action.

First Gyroscope Embodiment

A resonator system according to either of the two preceding resonator system embodiments may be implemented in a gyroscope if it is configured to enable two orthogonal resonance modes and if it comprises at least two transducers, one for actuating the drive motion and one for sensing the secondary rotational oscillation motion which results from the Coriolis force when the gyroscope undergoes angular motion. Any resonator and flexure configuration described in the preceding resonator embodiments may be implemented in the following gyroscope embodiments. In general terms, the benefit of using resonators according to the preceding embodiments in a gyroscope is that a high coupling factor is obtained in the drive transducers and a large signal is obtained in the sense transducers.

Figure 28:
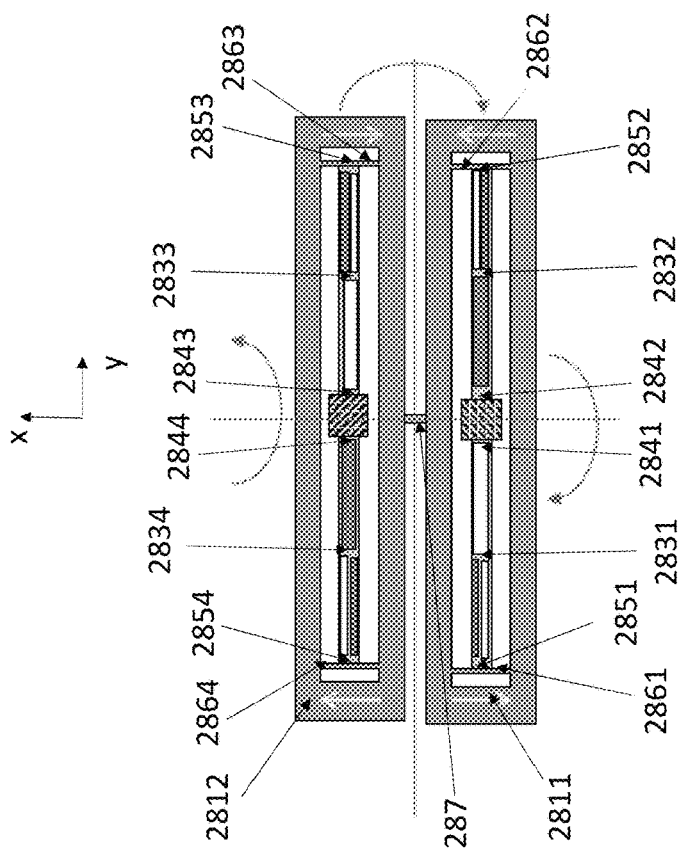
FIG. 28 also illustrates a gyroscope according to a first gyroscope embodiment.

Several transducer configurations are possible in a gyroscope. FIGS. 26-28 illustrate three alternative transducer configurations in gyroscopes according to a first gyroscope embodiment.

FIG. 26 illustrates a gyroscope with a resonator system where a first inertial mass 2611 can be driven to rotational in-plane oscillation by the drive transducers on first and second suspenders 2631 and 2632. The bending spring 267 couples this in-plane oscillation to the second inertial mass 2612. Other coupling mechanisms may also be used. Both inertial masses 2611 and 2612 will obtain the same in-plane rotation amplitude, as illustrated by the white arrows on the inertial masses. If the gyroscope then undergoes rotation about the y-axis, the Coriolis force will induce a secondary rotational oscillation about the x-axis. This oscillation may be detected and measured by sense transducers on third and fourth suspender 2633 and 2634. In this case the first and second suspenders 2631 and 2632 attached to a first inertial mass 2611 comprise only in-plane transducers, while the third and fourth suspenders 2633 and 2634 attached to a second inertial mass 2612 comprise only out-of-plane transducers The transducers on third and fourth suspenders 2633 and 2634 may also be used as drive transducers, and the transducers on first and second suspenders 2631 and 2632 may be used as sense transducers. However, it may be preferable to use out-of-plane transducers as sense transducers because they usually have better electro-mechanical coupling than in-plane transducers. In other words, the sense signal tends to be stronger in an out-of-plane transducer than in an in-plane transducer, and maximizing the sense signal is usually a more important consideration than maximizing the driving force.

The in-plane and out-of-plane resonance frequencies may preferably be close to each other. The rotational inertia in relation to the rotation axes is the same in in-plane oscillation and out-of-plane oscillation, at least when the centers of gravity coincide with the anchor points and the rotational axes pass through the anchor point. The resonance frequencies may be made very close to equal by making the thickness of the suspenders very close or equal to their width. In other words, the transversal breadth of each suspender may be close to equal to the vertical thickness of that suspender, and both the transversal breadths and vertical thicknesses of all suspenders may be close to equal In a gyroscope according to this first gyroscope embodiment, the first suspender attached to each inertial mass may comprise at least one in-plane transducer, while the second suspender attached to each inertial mass may comprise at least one out-of-plane transducer.

FIG. 27 illustrates a gyroscope where both resonators comprise in-plane transducers on second and fourth suspenders 2732, 2734 and out-of-plane transducers on first and third suspenders 2731, 2733. The spring 277 may be a bending spring or a torsional spring depending on which transducers are used as drive transducers. Other coupling mechanisms may also be used. In FIG. 27 both out-of-plane transducers are located on the right and both in-plane transducers on the left. In this configuration, the out-of-plane transducers on first and third suspenders 2731 and 2733 will have opposite polarities, so the lower electrodes of both transducers can be at the same potential. It is also possible to configure out-of-plane transducers on second and third suspenders 2732 and 2733 and to configure in-plane transducers on first and fourth suspenders 2731 and 2734. The top electrodes of the out-of-plane transducers will then have the same polarity and more complex wiring is required for differential detection.

FIG. 28 illustrates a gyroscope where both in-plane and out-of-plane transducers have been placed on each suspender 2831, 2832, 2833 and 2834. In other words, each suspender comprises at least one in-plane transducer and at least one out-of-plane transducer. It is preferable to place the in-plane transducers closer to second attachment points 2851-2854 and out-of-plane transducers closer to first attachment points 2841-2844, as illustrated in FIG. 28, and to use the in-plane transducers as drive transducers and out-of-plane transducers as sense transducers. However, the opposite configuration is possible on both counts.

A person skilled in the art will understand that a complete gyroscope may also include additional functions, such as detection of the primary amplitude and a force feedback or quadrature signal cancelling for the sense mode. These functions can be accomplished with additional transducers, which can be placed either on the suspenders illustrated in FIGS. 26-28 or on auxiliary suspender structures. However, such additional functions, suspenders and transducers will not be described in further detail in this disclosure.

All variants of this first gyroscope embodiment may be implemented together with any of the preceding resonator embodiments and resonator system embodiments.

Second Gyroscope Embodiment

Figure 29:
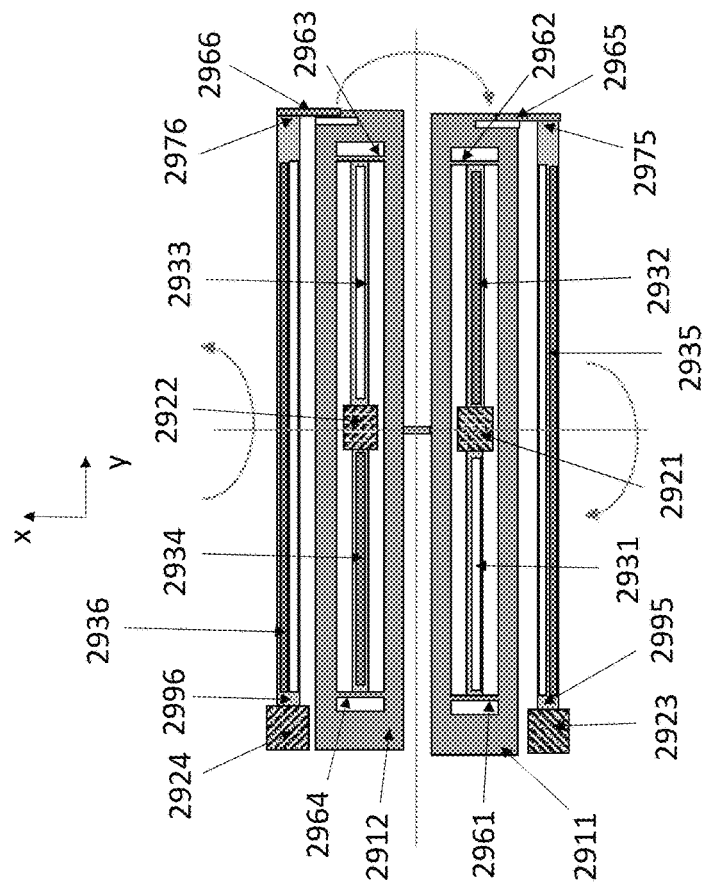
FIG. 29 illustrates a gyroscope according to a second gyroscope embodiment.
Figure 31:
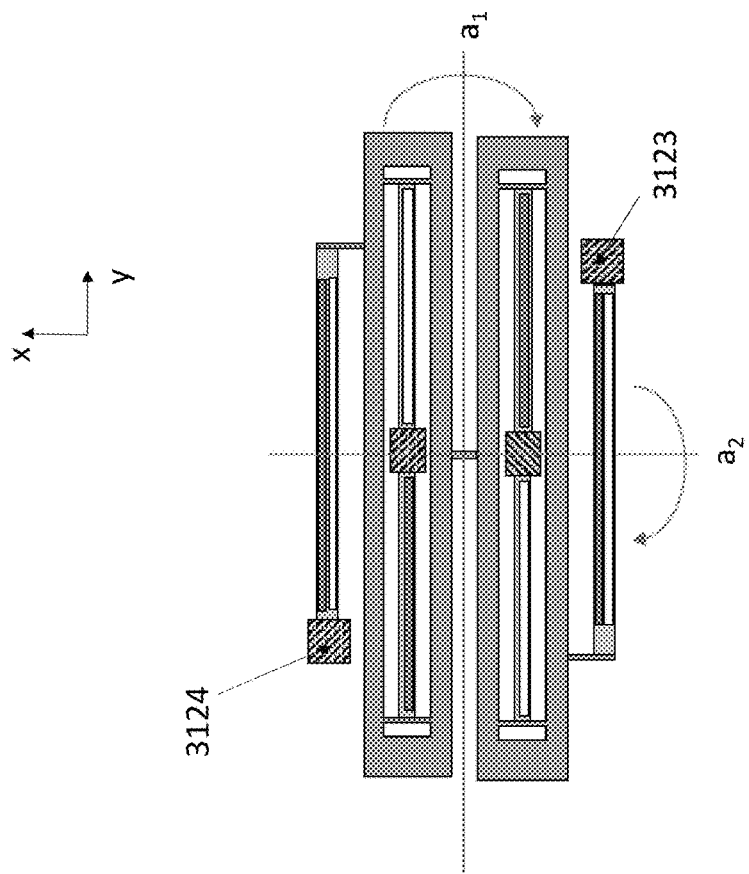
FIG. 31 also illustrates a gyroscope according to a second gyroscope embodiment.
Figure 30:
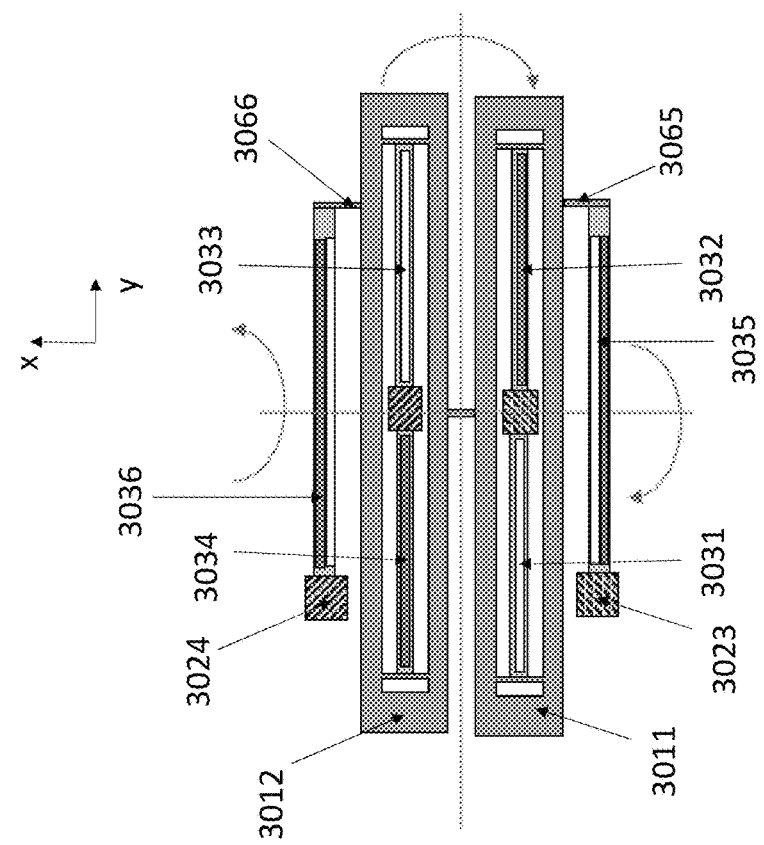
FIG. 30 also illustrates a gyroscope according to a second gyroscope embodiment.

FIGS. 29-31 illustrate resonator systems according to a second gyroscope embodiment, which may be implemented in conjunction with the first gyroscope embodiment. In this embodiment the resonator system additionally comprises at least one external suspender coated with a piezoelectric transducer structure configured to drive or detect the oscillating rotary movement of an inertial mass, wherein one end of the external suspender is attached to an anchor point and the other end of the external suspender is attached with a flexure to the inertial mass.

FIG. 29 illustrates a resonator system with first, second, third and fourth suspenders 2931-2934 attached to first and second anchor points 2921 and 2922 and inertial masses 2911 and 2912, respectively, by means described in preceding embodiments. The suspenders 2931-2934 may be called "internal" suspenders because they are located in the central openings of inertial masses 2911 and 2912.

In the illustrated resonator system, fifth and sixth suspenders 2935 and 2936 have been placed adjacent to the inertial masses 2911 and 2912. These fifth and sixth suspenders may called "external suspenders" because they are not located in the central openings of the inertial masses. In the illustrated system, the internal suspenders 2931-2934 system are coated with out-of-plane transducers, and the external suspenders 2935-2936 are coated with in-plane transducers. This arrangement may be reversed, so that suspenders 2931-2934 are coated with in-plane transducers and suspenders 2935-2936 with out-of-plane transducers. In either case, the additional suspenders facilitate the use of more transducer area both for driving the resonator system and for sensing the oscillation which arises from the Coriolis effect.

In addition to the first and second anchor points 2921 and 2922 within the central openings of the inertial masses 2911 and 2912, the gyroscope illustrated in FIG. 29 comprises third and fourth anchor points 2923 and 2924. Each external suspender 2935 and 2936 may be attached from a first end to a second anchor point at third attachment points 2995, 2996. A second end of each fifth and sixth suspenders 2935 and 2936 may be attached at a fourth attachment point 2975, 2976 to a fifth and sixth flexures 2965 and 2966 (the first, second, third and fourth flexures 2961-2964 being within the inertial masses as illustrated). The flexures 2965 and 2966 should provide flexibility for in-plane and out-of-plane rotation since the in-plane and out-of-plane angles of the end 2975 or 2976 of the suspender 2935 or 2936 and the corresponding angles of the corresponding inertial mass 2911 or 2912 will be different and no torque should be generated by the flexure at the attachment point. Also, flexibility should be provided for translation along the y-axis to prevent tension of the suspenders 2935 and 2936 due to bending and thus nonlinearity of the suspenders. But the flexures 2965 and 2966 should be stiff for translation along the x- or z-axes in order to be able to transmit force in x- or z-directions. One of these forms of stiffness is needed depending on which transducers are used for driving and which for sensing. The transducers on the internal suspenders 2931-2934 may be used as drive transducers and the transducers on the external suspenders 2935-2936 may be used as sense transducers, or vice versa.

FIG. 30 illustrates a gyroscope where the external suspenders 3035 and 3036 are shorter than the internal suspenders 3031-3034. The external suspenders 3035 and 3036 may also be longer than the internal suspenders, and the position of the second anchor points 3023 and 3024 may vary accordingly. The flexures 3065-3066 may be attached to the inertial masses 3011 and 3012 anywhere along the length of the inertial masses. FIG. 31 illustrates an alternative configuration where the second anchor points 3123 and 3124 are located on opposite sides of both symmetry axes $a_1$ and $a_2$ which pass through the center of gravity of the resonator system.

All variants of this second gyroscope embodiment may be implemented together with any of the preceding resonator embodiments and resonator system embodiments.

Clock Oscillator

Any resonator and flexure configuration described in the preceding resonator embodiments and resonator system embodiments can be implemented in a clock oscillator with additions known from the prior art. In general terms, the benefits of using resonators according to the preceding embodiments in a clock oscillator include at least a high coupling factor, small motional resistance, reliable startup and low noise.

The invention claimed is:

1. A rotational resonator comprising:
a substrate with at least one anchor point and an inertial mass with a first longitudinal end and a second longitudinal end, wherein the first longitudinal end and second longitudinal end lie on opposite sides of the at least one anchor point, and
wherein the inertial mass is suspended from the at least one anchor points by at least one suspender extending from the at least one anchor points toward the first longitudinal end of the inertial mass, and by at least one suspender extending from the at least one anchor point toward the second longitudinal end of the inertial mass,
wherein each suspender is attached from a first attachment point to the anchor point of the respective suspender, and from a second attachment point to the inertial mass,
wherein one or more of the suspenders are coated with a piezoelectric transducer structure configured to drive or detect oscillating rotary movement in the inertial mass,
wherein at least one coated suspender is attached from the second attachment point of the respective suspender to the inertial mass with a flexure.

2. The rotational resonator according to claim 1, wherein each flexure is stiff for translational movement out of an inertial mass plane but flexible for bending in the inertial mass plane and flexible for torsional twisting about an axis which is parallel to a lengthwise direction of the flexure.

3. The rotational resonator according to claim 1, wherein a height/breadth aspect ratios of the flexure ranges from 2 to 6, and a length/breadth aspect ratio of the flexure ranges from 2 to 6.

4. The rotational resonator according to claim 1, wherein the inertial mass is suspended from the at least one anchor point by three or more suspenders.

5. The rotational resonator according to claim 1, wherein a length of the piezoelectric transducer structure on the coated suspender extending from an anchor point toward the first longitudinal end of the inertial mass differs from a length of the piezoelectric transducer structure on the coated suspender extending from the same anchor point toward the second longitudinal end of the inertial mass, or a width of the piezoelectric transducer structure on the coated suspender extending from an anchor point toward the first longitudinal end of the inertial mass differs from a width of the piezoelectric transducer structure on the coated suspender extending from the same anchor point toward the second longitudinal end of the inertial mass.

6. The rotational resonator according to claim 1, wherein each piezoelectric transducer coated on each coated suspender extending from an anchor point toward the first longitudinal end of the inertial mass is configured for in-plane bending, and each piezoelectric transducer on each coated suspender extending from an anchor point toward the second longitudinal end of the inertial mass is configured for out-of-plane bending.

7. The rotational resonator according to claim 1, wherein each coated suspender is coated with one piezoelectric transducer structure configured for in-plane bending and one transducer structure configured for out-of-plane bending.

8. The rotational resonator according to claim 1, wherein the piezoelectric transducer structure on at least one coated suspender extends along the suspender from the first attachment point to a point whose distance from the first attachment point corresponds to 50-70% of a length of the at least one suspender.

9. A rotational resonator system comprising:
a substrate with at least a first anchor point and a second anchor point, and first and second inertial masses which are mechanically coupled to each other,
wherein the first inertial mass is suspended from the first anchor point by at least a first suspender and a second suspender, and the second inertial mass is suspended from the second anchor point by at least a third suspender and a fourth suspender,
wherein the first and third suspenders extend from the respective anchor points of the first and third suspenders towards a first longitudinal end of the resonator system, wherein the second and fourth suspenders extend from the respective anchor points of the second and fourth suspenders towards a second longitudinal end of the resonator system, wherein further the first and second suspenders are attached from the respective first attachment points of the first and second suspenders to the first anchor point and the third and fourth suspenders are attached from the respective first attachment points of the third and fourth suspenders to the second anchor point, wherein further at least one of the suspenders is coated with a piezoelectric transducer structure configured to drive or detect oscillating rotary movement in the inertial mass attached to the respective at least one coated suspender, wherein at least one of the coated suspenders is attached from its second attachment point to either the first or the second inertial mass with a flexure.

10. The rotational resonator system according to claim 9, wherein the flexure is stiff for translational movement out of an inertial mass plane but flexible for bending in the inertial mass plane and flexible for torsional twisting about an axis which is parallel to a lengthwise direction of the flexure.

11. The rotational resonator system according to claim 9, wherein a height/breadth aspect ratios of the flexure ranges from 2 to 6, and a length/breadth aspect ratio of the flexure ranges from 2 to 6.

12. The rotational resonator system according to claim 9, wherein the first and second inertial masses are mechanically coupled and synchronized with a single torsion spring or a single bending spring.

13. The rotational resonator system according to claim 9, wherein the first and second inertial masses are mechanically coupled and synchronized with a spring system which comprises a third anchor point between the first and second inertial masses, a first longitudinal spring extending from the third anchor point to a first transversal bar, a second longitudinal spring extending from the first transversal bar to the first inertial mass, and a third longitudinal spring extending from the first transversal bar to the second inertial mass.

14. The rotational resonator system according to claim 13, wherein the spring system also comprises a fourth anchor point between the first and second inertial masses, a fourth longitudinal spring extending from the fourth anchor point to a second transversal bar, a fifth longitudinal spring extending from the second transversal bar to the first inertial mass, and a sixth longitudinal spring extending from the second transversal bar to the second inertial mass.

15. The rotational resonator system according to claim 9, wherein the first and the second suspender attached to a first inertial mass comprise only in-plane transducers, while the third and the fourth suspender attached to a second inertial mass comprise only out-of-plane transducers.

16. The rotational resonator system according to claim 15, wherein a transversal breadth of each suspender is close to equal to a vertical thickness of that suspender, and that both the transversal breadths and vertical thicknesses of all suspenders are close to equal.

17. The rotational resonator system according to claim 9, wherein the first suspender attached to each inertial mass comprises at least one in-plane transducer, while the second suspender attached to the same inertial mass comprises at least one out-of-plane transducer.

18. The rotational resonator system according to claim 9, wherein each suspender comprises at least one in-plane transducer and at least one out-of-plane transducer.

19. The rotational resonator system according to claim 9, wherein the resonator system additionally comprises at least one external suspender coated with a piezoelectric transducer structure configured to drive or detect the oscillating rotary movement of the first or second inertial mass, wherein one end of the external suspender is attached to an anchor point and the other end of the external suspender is attached with a flexure to the first or the second inertial mass.

20. A clock oscillator comprising the rotational resonator system according to claim 9.

21. A gyroscope comprising the rotational resonator system according to claim 15.

* * * * *